United States Patent
Mori et al.

(10) Patent No.: US 6,262,930 B1
(45) Date of Patent: Jul. 17, 2001

(54) SEMICONDUCTOR MEMORY DEVICE WITH OVERDRIVEN SENSE AMPLIFIER AND STABILIZED POWER-SUPPLY CIRCUIT OF SOURCE FOLLOWER TYPE

(75) Inventors: Kaoru Mori; Masato Matsumiya; Ayako Kitamoto; Shinichi Yamada; Yuki Ishii; Hideki Kanou; Masato Takita, all of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/612,281

(22) Filed: Jul. 7, 2000

Related U.S. Application Data

(62) Division of application No. 09/342,060, filed on Jun. 29, 1999, now Pat. No. 6,115,316.

(30) Foreign Application Priority Data

Jun. 29, 1998 (JP) .................................. 10-182373
Jun. 30, 1998 (JP) .................................. 10-185098

(51) Int. Cl.$^7$ .................................................. G11C 7/00
(52) U.S. Cl. ............... 365/226; 365/189.11; 365/189.17; 365/205; 365/230.03; 327/530
(58) Field of Search ............... 365/205, 189.07, 365/189.11, 189.01, 230.03, 226; 327/530

(56) References Cited

U.S. PATENT DOCUMENTS

| | | | |
|---|---|---|---|
| 5,490,111 | 2/1996 | Sakata | 365/189.11 |
| 5,594,695 * | 1/1997 | Yim et al. | 365/205 |
| 5,668,762 | 9/1997 | Suwa | 365/189.11 |
| 5,708,616 | 1/1998 | Choi | 365/205 |
| 5,719,814 | 2/1998 | Ishikawa | 365/205 |

FOREIGN PATENT DOCUMENTS 9-63271   3/1997   (JP) .

* cited by examiner

Primary Examiner—Hoai V. Ho
(74) Attorney, Agent, or Firm—Arent Fox Kintner Plotkin & Kahn, PLLC

(57) ABSTRACT

To reduce current consumption, there is provided a circuit for each bank, comprising selection circuits 26 through 28 each for selecting either a normal supply voltage Vii or a higher supply voltage Vjj as a supply voltage VH0 in response to a selection control signals SC0 and *SC0, a selection control circuit 22 for generating the signals SC0 and *SC0 to make the selection circuits select Vii when a bank activation signal BRAS0 is inactive and Vjj for a predetermined period in response to activation of BRAS0, and sense amplifier driving circuits 111 through 113 for supplying the ground voltage and VH0 to the sense amplifier rows in response to activation of sense amplifier control signals. To stabilize the output voltage Vii of the power supply circuit having a NMOS transistor, the drain electrode, gate and source electrodes of which are at VCC, VG and approximately Vii=VG−Vth, where Vth is the threshold voltage of the NMOS transistor 45, a leak circuit is employed. The leak circuit has a NMOS transistor connected between Vii and ground. Wasteful power consumption by the current flowing to the leak circuit is negligibly small, e.g. 1 to 10 μA, and the variation of the supply voltage Vii reduces effectively.

11 Claims, 23 Drawing Sheets

SEMICONDUCTOR MEMORY DEVICE WITH OVERDRIVEN SENSE AMPLIFIER AND STABILIZED POWER-SUPPLY CIRCUIT OF SOURCE FOLLOWER TYPE

This application is a divisional application of parent application Ser. No. 09/342,060, filed Jun. 29, 1999, U.S. Pat. No. 6,115,316.

BACKGROUND OF THE INVENTION

1. Field of the Invention

The present invention relates to a semiconductor memory device, having multi-bank, with overdriven sense amplifiers and a stabilized power-supply circuit of source follower type for use in a semiconductor device such as a memory device.

2. Description of the Related Art

FIG. 21 shows a circuit associated with a sense amplifier 10 of a prior art synchronous dynamic random access memory device (SDRAM).

The sense amplifier 10 is activated by a voltage between power supply voltages VP and VN provided from sense amplifier driving circuit 11. In the circuit 11, PMOS transistor 12 and NMOS transistors 13 through 15 are connected in series, a sense amplifier control signal C0 from a control circuit (not shown) is provided to the gate electrode of the NMOS transistor 15, and a signal *C0 complementary to this signal ('*' denotes active low) is provided to the gate electrodes of the transistor 12 through 14. In a case where the sense amplifier control signals C0 and *C0 are low and high, respectively, the transistors 13 and 14 are on, and transistors 12 and 15 are off, whereby a voltages Vii/2 are provided through the transistors 13 and 14 as VP and VN to the sense amplifier 10, and the sense amplifier 10 is inactive. In this state, transfer gates 16 and 17 are turned on, and a pre-charge circuit 18 is turned on with pre-charge signal PR activating, whereby bit lines BL01, BL02, *BL01, and *BL02 are pre-charged up to the voltage Vii/2. The voltage Vii/2 is applied to the cell plate of the capacitor of a memory cell 19.

For example, when data is read out from the memory cell 19 storing "HIGH", a word line WL0 is raised and a positive charge moves from the memory cell 19 to the bit line BL01, whereby a voltage difference of approximately 100 through 200 mV occurs between the bit lines BL01 and *BL01. In order to activate the sense amplifier 10 faster, in response to the change in a row address, as shown in FIG. 22, a power supply voltage VH rises from Vii to Vjj in order to overdrive a bit line. For example, the voltages Vii and Vjj are 1.5V and 2.0V, respectively.

Next, the sense amplifier control signals C0 and *C0 transit to a high and a low, respectively, transistors 12 and 15 are turned on, transistors 13 and 14 are turned off, and the voltages VH and 0V are provided as the VP and VN through the transistors 12 and 15, respectively, to the sense amplifier 10. Thereby, the sense amplifier 10 is activated to amplify the voltage difference between the bit lines BL01 and *BL01. After the bit lines BL01 and *BL01 have fully swung between the voltages Vii and 0V by this amplification, the voltage VH is lowered to the voltage Vii.

When the reading has completed, the word line WL0 goes low, and then, the sense amplifier control signals C0 and *C0 go low and high, respectively, and the VP and VN both return to the voltage Vii/2, whereby the sense amplifier 1C becomes inactive. Further, the pre-charge circuit 18 is turned on with the pre-charge signal PR activating, and the bit line voltage is reset to Vii/2.

In a prior art SDRAM equipped with a plurality of banks, the voltage VH is commonly provided to sense amplifier driving circuits of the respective banks. While performing processing of the banks before being switched, the bank after being switched is processed in parallel. Therefore, as shown in FIG. 23, for example, when banks 0 through 3 are switched successively, the power supply voltage VH does not drop to the voltage Vii but maintains the voltage Vjj.

As a result, current is consumed needlessly, and also, since the high voltage period becomes longer than necessary, deterioration of transistor characteristics is accelerated.

On the other hand, pre-charge by the pre-charge circuit 18 in FIG. 21 is rapidly performed primarily with the short circuit of the bit lines BL02 and *BL02, and supplementary pre-charge from the supply line at a voltage Vii/2 is gradually performed since Vii/2 is generated by voltage dividing with resistors and a current flows through the resistor. Therefore, when a reading is performed again from the bank 0 after the bank 3, and this reading is from the same bit line pair whose voltage difference was amplified at the last reading from the bank 0, as shown in FIG. 23, pre-charge voltage Vpr2 becomes higher than the normal pre-charge voltage Vpr1=Vii/2. A voltage difference ΔV between a bit line pair after being read thereon from a memory cell and before being amplified depends on a pre-charged voltage Vpr of the bit line pair, and is expressed by the following equation.

$$\Delta V = (Vsn - Vpr) \cdot Cs / (CBL + Cs)$$

where, Cs is the capacity of the memory cell, CBL is the parasitic capacity of the bit line pair, and Vsn is the voltage of the storage node 191 before the reading.

As clear from this equation, if the Vpr rises under Vsn being constant, ΔV decreases. That is, the voltage difference ΔV2 in FIG. 23 between a bit line pair becomes smaller than the normal ΔV1.

If the voltage difference ΔV between a bit line pair becomes smaller, since the margin of operating without error reduces in regard to the sense amplifiers, the sense amplifier 10 may erroneously operate due to variance in the element characteristics of the sense amplifier 10. Furthermore, a refresh cycle time must be shortened to maintain the storage node voltage Vsn high, resulting in an increase of a wasteful current.

There is another cause to raise the pre-charged voltage Vpr if a power supply circuit of source follower type is employed for driving sense amplifiers even if the above-described overdriving of sense amplifiers is not used.

That is, if a NMOS transistor is employed at the output stage in a power supply circuit for the sense amplifiers, letting the voltages of the drain, gate and source electrodes thereof be an external power supply voltage, a constant VG and the output voltage Vii of the power supply circuit, respectively, the relation Vii=VG−Vth approximately holds, where Vth is a threshold voltage of the NMOS transistor. However, since the current consumption at the sense amplifier is zero after the voltage between a bit line pair is fully swung by the sense amplifier and a little current flows through the NMOS transistor, Vii rises and thereby the precharge voltage Vii/2 goes up, resulting in an increase in a wasteful current.

SUMMARY OF THE INVENTION

Accordingly, it is an object of the present invention to provide a semiconductor memory device having an overdriven sense amplifier with a wasteful current being reduced.

It is another object of the present invention to provide a more stabilized power-supply circuit of source follower type.

In one aspect of the present invention, there is provided a semiconductor memory device including a plurality of banks, each bank comprising an amplifier for amplifying a voltage between a bit line pair, the semiconductor memory device comprising for each bank: a selection circuit, having an output, for selecting either a first or a second power supply voltage to provide from the output in response to a selection control signal, the second power supply voltage being for activating the sense amplifier faster than using the first power supply voltage; a selection control circuits for generating the selection control signal for selecting the second power supply voltage for a predetermined period in response to activation of a corresponding bank activation signal and selecting the first power supply voltage thereafter; and a sense amplifier driving circuit for supplying the power supply voltage selected by the selection circuit to the sense amplifier in response to activation of a sense amplifier control signal.

With this structure, the selection control circuits independently operate in response to the respective bank activation signals, the respective selection circuits for the respective banks are independently controlled with the outputs from the selection control circuits, and the power supply voltage is supplied via the selection circuits and the sense amplifier driving circuits to the sense amplifiers. Therefore, the power supply voltage for the sense amplifiers becomes the second power supply voltage, in response to the activation of the corresponding bank, only for a period required to speed up the activation of the sense amplifiers.

Accordingly, a wasteful output current of the power supply circuit is reduced, and since the unnecessarily applying period of an overdriving voltage to transistors is reduced, the characteristics deterioration thereof are also reduced.

Furthermore, since the lowering of the voltage difference between a bit line pair after being read from a memory cell and before being amplified is prevented, in regard to the sense amplifiers, the margin of operating without error becomes larger, and also current consumption can be reduced with making a refresh cycle time longer.

In another aspect of the present invention, there is provided a power supply circuit for driving a load, comprising: a voltage regulation circuit for providing a regulated voltage lower than a power supply voltage; an FET having a drain electrode coupled to the power supply voltage, a source electrode coupled to the load, and a gate electrode coupled to receive the regulated voltage; and a leak circuit having a transistor, the transistor having a control input, and a current path coupled between the source electrode and a reference supply voltage, for leaking a current with the transistor being on.

According to this aspect of the present invention, with a small current flowing through the transistor, the variation of the supply voltage reduces effectively.

If this power supply circuit is applied for the sense amplifiers in a semiconductor memory device, rising of the pre-charge potential on a bit line pair is prevented. Therefore, in regard to the sense amplifiers, the margin of operating without error becomes larger, and also current consumption can be reduced with making a refresh cycle time longer.

Other aspects, objects, and the advantages of the present invention will become apparent from the following detailed description taken in connection with the accompanying drawings.

DESCRIPTION OF THE PREFERRED EMBODIMENTS

Figure 1:
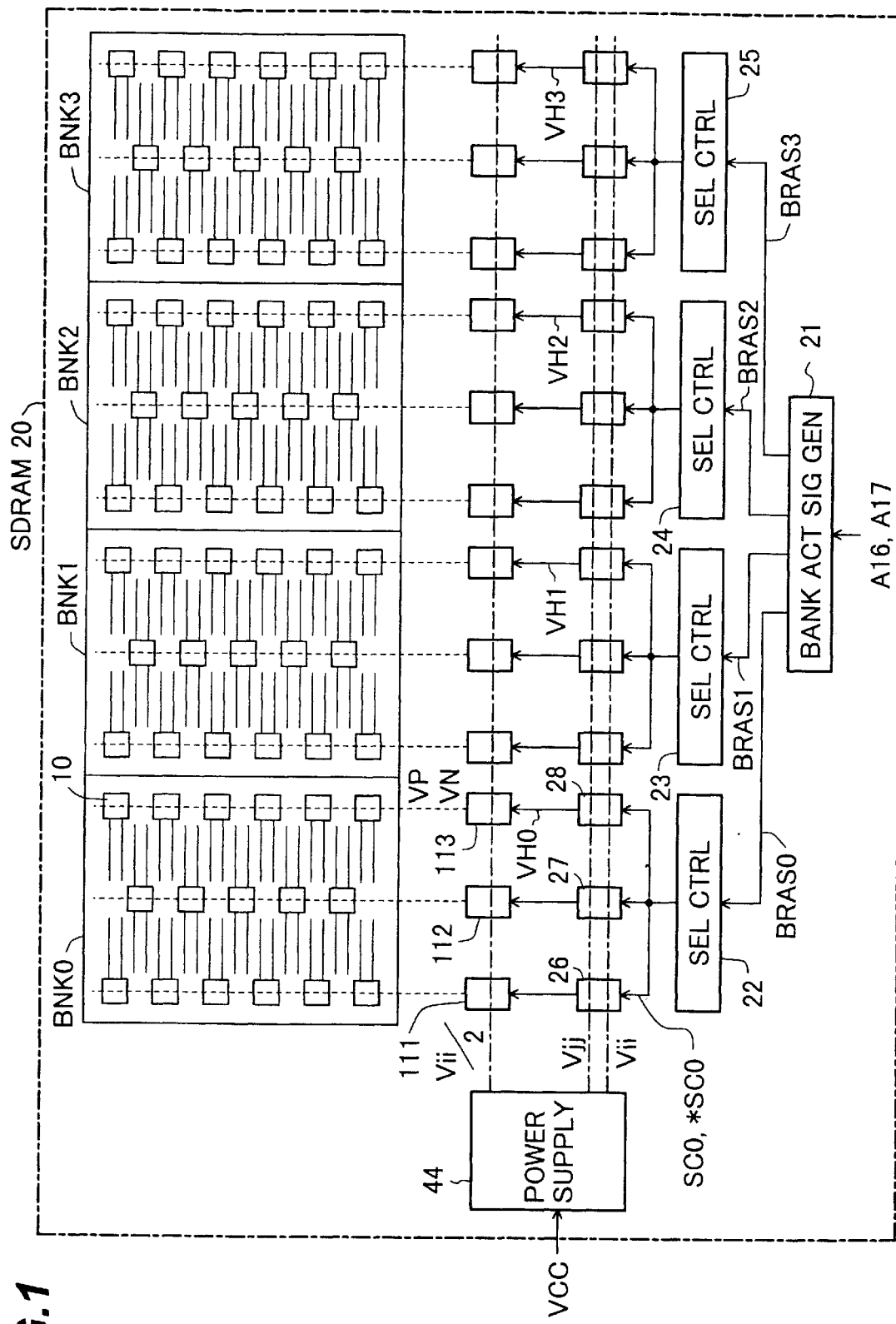
FIG. 1 is a schematic block diagram showing a circuits associated with a sense amplifiers in a synchronous DRAM according to the first embodiment of the present invention.

Referring now to the drawings, wherein like reference characters designate like or corresponding parts throughout several views, preferred embodiments of the present invention are described below. A signal which is active low will be denoted with adding * to a reference character.

It should be noted that the use of the terms "connected" and "coupled" indicates an electrical connection between two elements and can include an intervening element between the two "coupled" or "connected" elements.

First Embodiment

FIG. 1 shows a circuits associated with a sense amplifiers in a synchronous dynamic random access memory device (SDRAM) 20 according to the first embodiment of the present invention.

Figure 6:
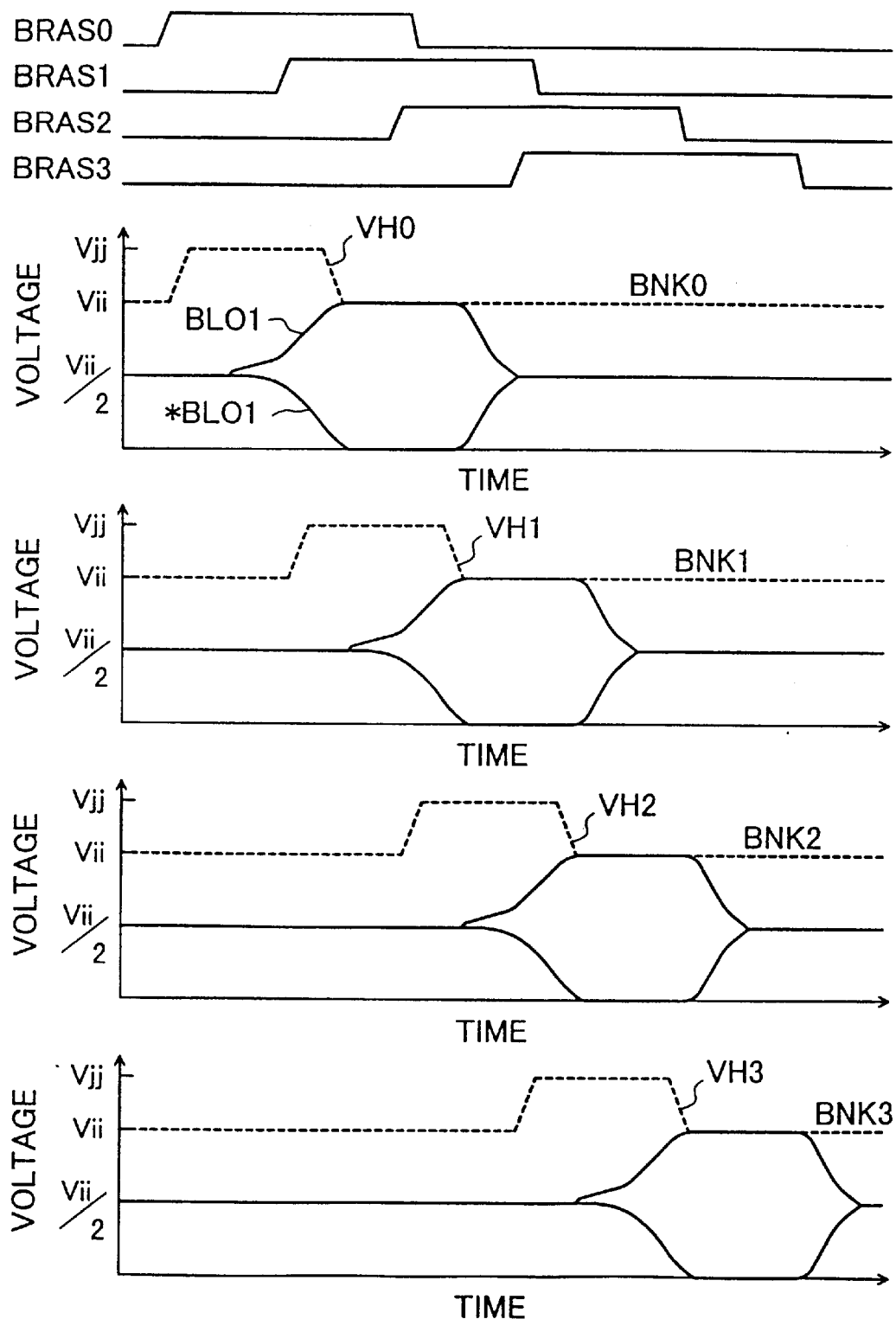
FIG. 6 are time charts showing operation of the circuit of FIG. 1 when banks BNK0 through BNK3 are selected successively.

The SDRAM 20 is equipped with banks BNK0 through BNK3, and the banks are selected by the upper two bits in address, for example, bits A16 and A17. A bank activation signal generating circuit 21 generates signals BRAS0 through BRAS3. Each of signals BRAS0 through BRAS3 is activated at a timing of issue of an activation command when the corresponding one of the decoded signals of the bank address bits A16 and A17 is activated, and is inactivated when access to the same row in the corresponding bank is ended. When switching banks, since a processing of a bank after being switched are performed in parallel with a processing of a bank before being switched, for example, when the banks BNK0 through BNK3 are selected successively as shown in FIG. 6, activating periods of the bank activation signals BRAS0 through BRAS3 partially overlap.

The signals BRAS0 through BRAS3 are provided to the selection control circuits 22 through 25, respectively, having the same structure to each other. The selection control circuit 22 generates, in response to the activation of the signal BRAS0, a selection control signal SC0 which is active for a predetermined period of time, and a selection control signal *SC0 which is complementary to the signal SC0, and provides the signals to the control inputs of the selection circuits 26 through 28 having the same structure to each other.

Figure 2:
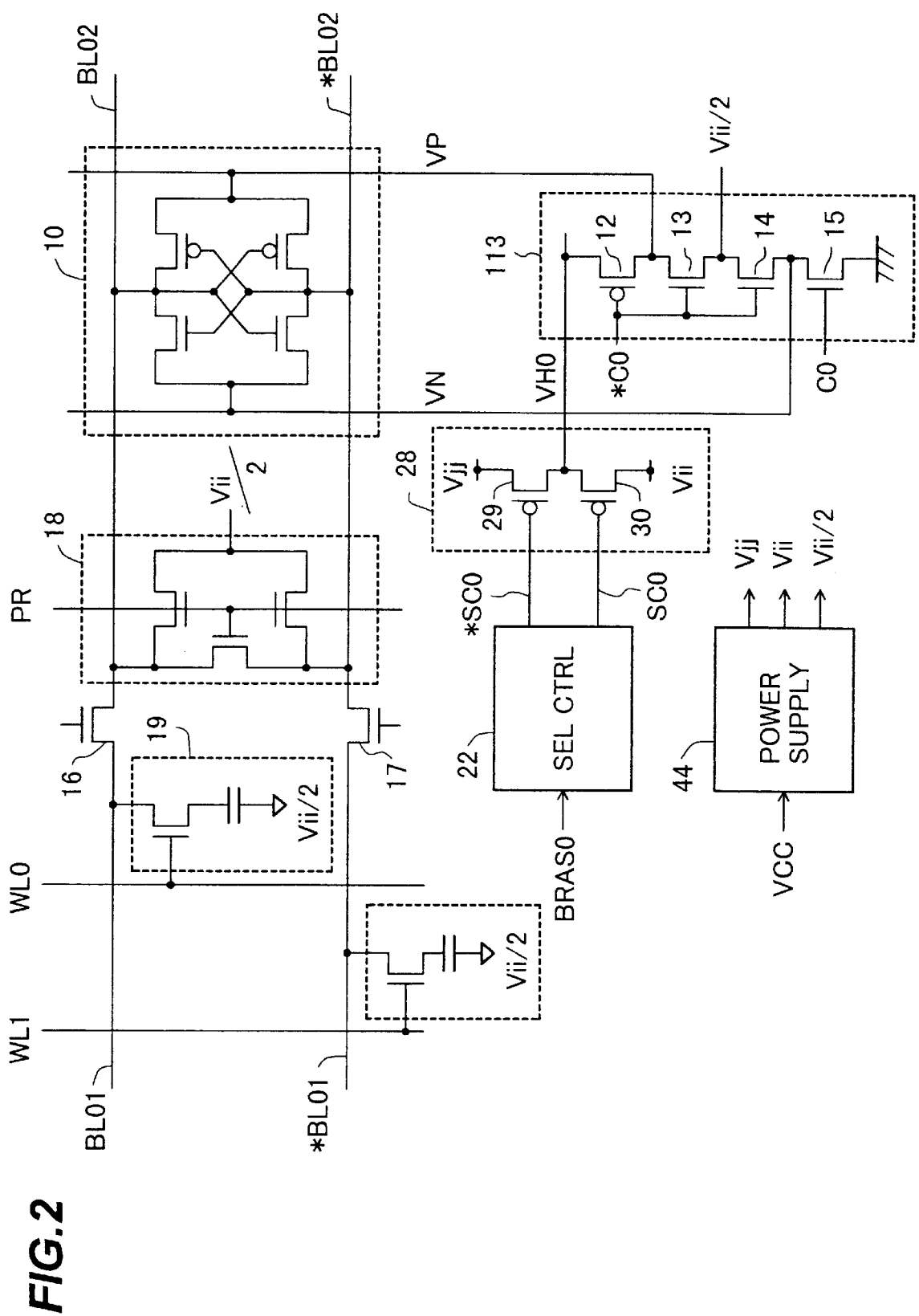
FIG. 2 is a circuit diagram showing a structural example of part of FIG. 1.

For example, in the selection circuit 28, as shown in FIG. 2, the source electrode of a PMOS transistor 29 is connected to a supply line at a voltage Vjj for activating sense amplifiers faster, and the drain electrode of the PMOS transistor 29 is connected via a PMOS transistor 30 to a supply line at a voltage Vii for normally activating the sense amplifiers. The signals *SC0 and SC0 from the circuit 28 are provided to the gate electrodes of the transistors 29 and 30, respectively. To the N well wherein the transistors 29 and 30 are formed, for example, the voltage Vjj is applied.

When the selection control signals *SC0 and SC0 are low and high, respectively, the transistor 29 and 30 on and off, respectively, and the voltage Vjj is outputted as VH0 through the transistor 29. On the contrary, when the selection control signals *SC0 and SC0 are high and low, respectively, the transistors 29 and 30 are off and on, respectively, and the voltage Vii is outputted as VH0 through the transistor 30. The voltage VH0 is provided as a power supply voltage to a sense amplifier driving circuit 113 with the same structure as the circuit 11 in FIG. 21.

Figure 21:
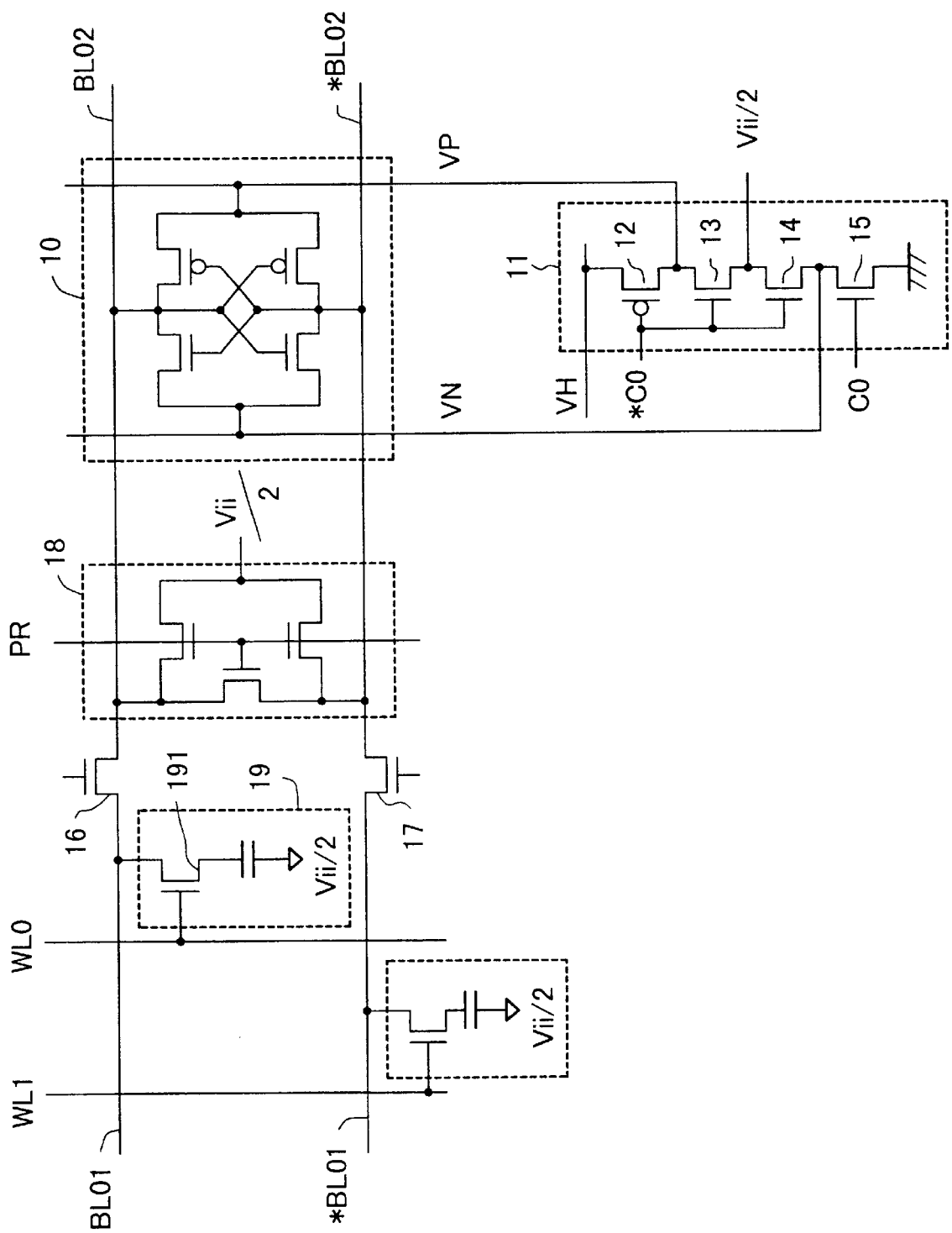
FIG. 21 is a diagram showing a circuit associated with a sense amplifier of a prior art synchronous DRAM.
Figure 22:
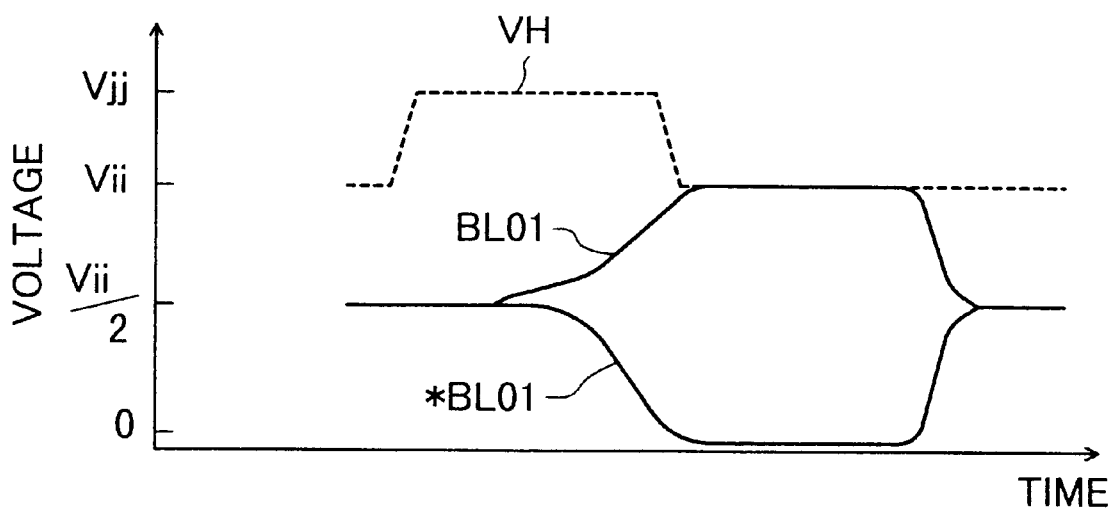
FIG. 22 is a voltage waveform diagram showing operation of the circuit of FIG. 21.
Figure 23:
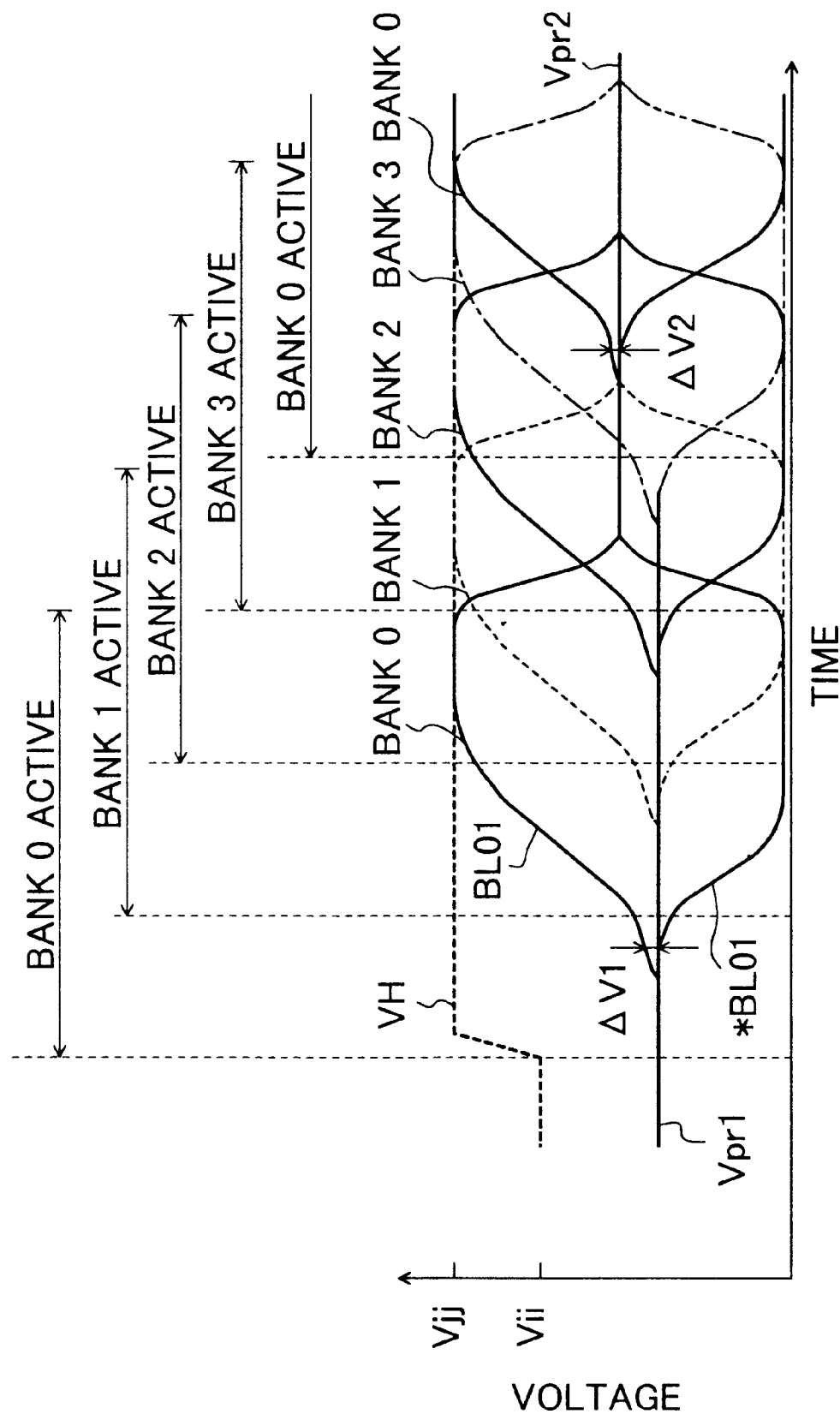
FIG. 23 is a prior art waveform diagram showing a power supply voltage for a sense amplifier and bit line pair voltages in respective banks when banks 0 through 3 are selected successively.

In FIG. 2, the same components as in FIG. 21 are attached with the same reference characters, and the overlapping description thereof is omitted.

Figure 3:
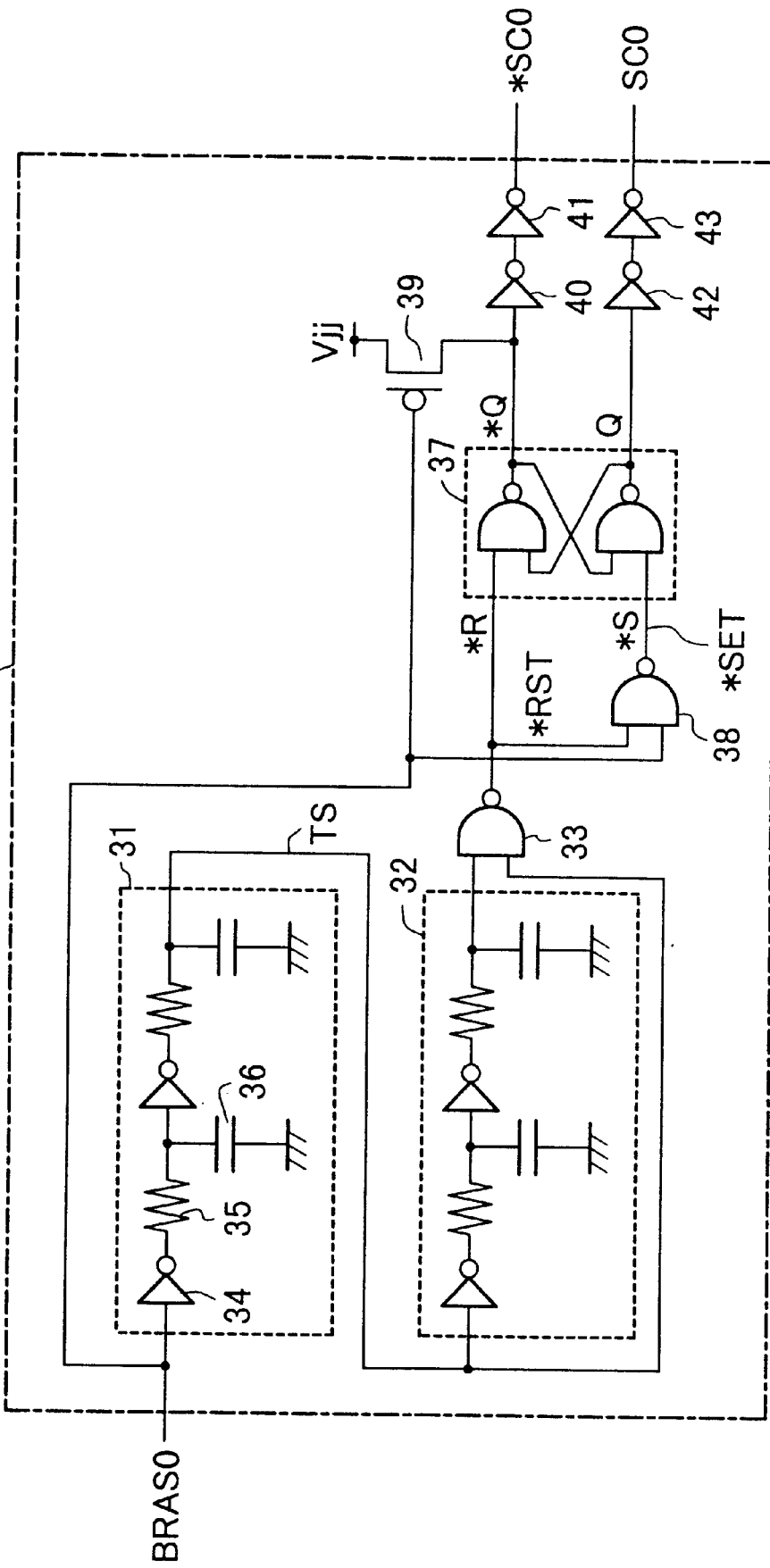
FIG. 3 is a circuit diagram showing a structural example of the selection control circuit in FIG. 2.
Figure 4:
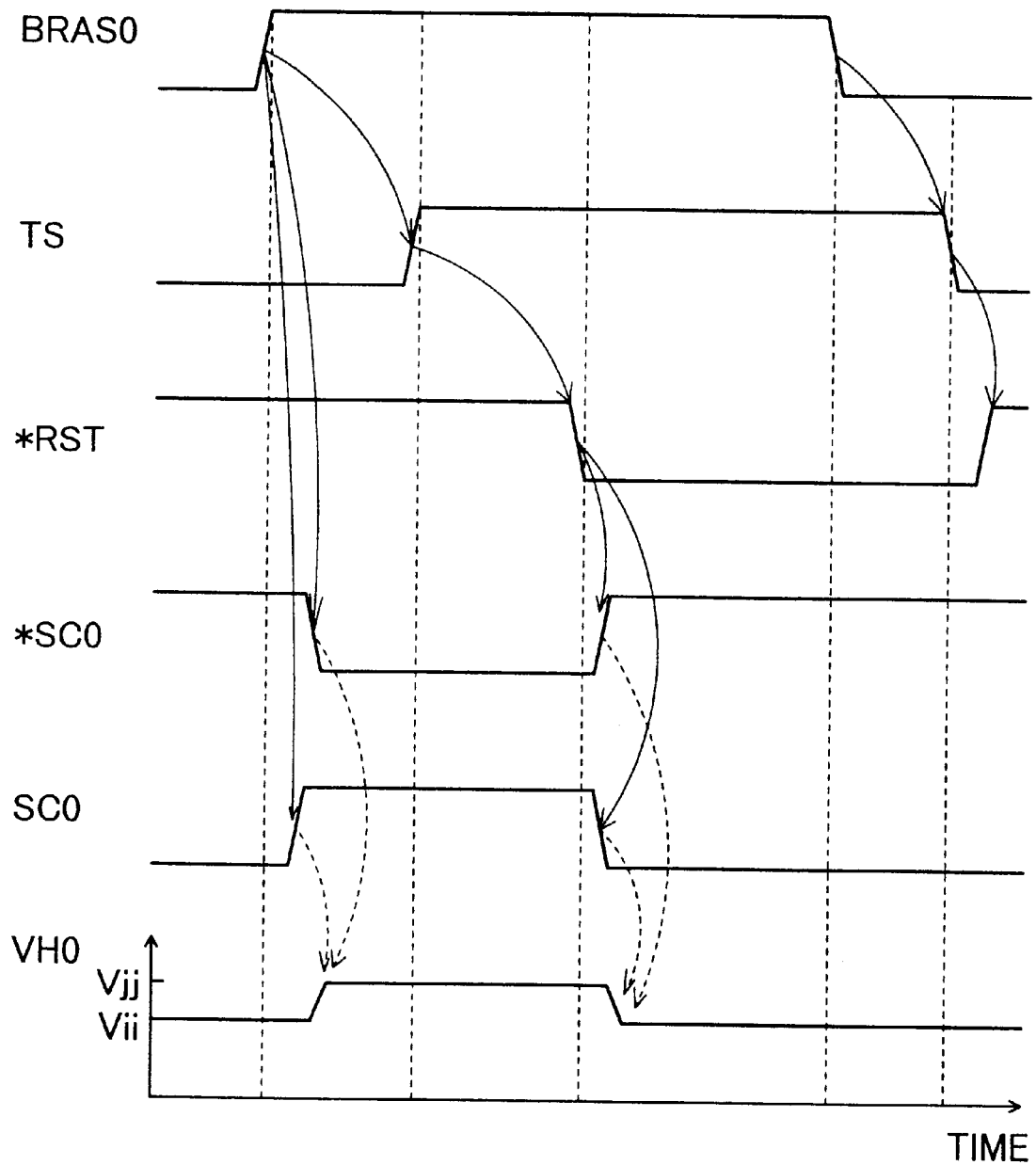
FIG. 4 are time charts showing operation of the circuit of FIG. 3.

FIG. 3 shows a structural example of the selection control circuit 22, and FIG. 4 are time charts showing the operation of this circuit.

In this circuit 22, the bank activation signal BRAS0 is provided through delay circuits 31 and 32 to one input of a NAND gate 33, while the output TS of the delay circuit 31 is provided to the other input of the NAND gate 33. The signal TS is used in a control circuit (not shown) as a timing signal to start the activation of the sense amplifier 10 with making the sense amplifier control signals C0 and *C0 in FIG. 2 high and low, respectively. The delay circuit 31 consists of even number, two for example, stages of basic delay circuits, connected in cascade, each having an inverter 34 and a CR integration circuit for delay which is connected to the output of the inverter 34.

The output *RST of the NAND gate 33 goes low for a period from a rise in the output of the delay circuit 32 until a fall in the signal TS, and is provided to the reset input *R of an RS flip-flop circuit 37. The reset signal *RST and the bank activation signal BRAS0 are provided to the NAND gate 38, and the output *SET thereof goes low for a period from a rise in the bank activation signal BRAS0 until a fall in the reset signal *RST, and is provided to the set input *S of the RS flip-flop circuit 37.

Immediately after the power is turned on, in order to cause the output of the RS flip-flop circuit 37 to be in an initial proper state, the PMOS transistor 39 is connected between the inversion output *Q of the RS flip-flop circuit 37 and the supply line at the voltage Vjj, and to the gate electrode thereof, the bank activation signal BRAS0 is provided. When the signal BRAS0 is low, the PMOS transistor 39 is on and the inversion output *Q is high. In this state, since the set input *S is high, the non-inversion output Q is low. Thereby, the initial state of the output of the RS flip-flop circuit 37 is made certain.

To the inversion output *Q of the RS flip-flop circuit 37, inverters 40 and 41 for amplifying driving capacity are connected in cascade, and likewise inverters 42 and 43 are connected in cascade to the non-inversion output Q of RS flip-flop circuit 37. The selection control signals SC0 and *SC0 are taken out from the inverters 43 and 41, respectively.

With such a structure, the selection control circuit 22 generates, in response to the activation of the bank activation signal BRAS0, the selection control signals SC0 and *SC0 which are active for a predetermined period of time.

Referring back to FIG. 1, to the selection circuits 26 through 28, the voltages Vii and Vjj from the power supply circuit 44 are provided. Either the voltage Vii or Vjj selected at the selection circuits 26 through 28 in response to the output of the selection control circuit 22 is provided to the sense amplifier driving circuits 111 through 113 having the same structure to each other. To the sense amplifier driving circuits 111 through 113, another voltage Vii/2 from the power supply circuit 44 is supplied.

Figure 5:
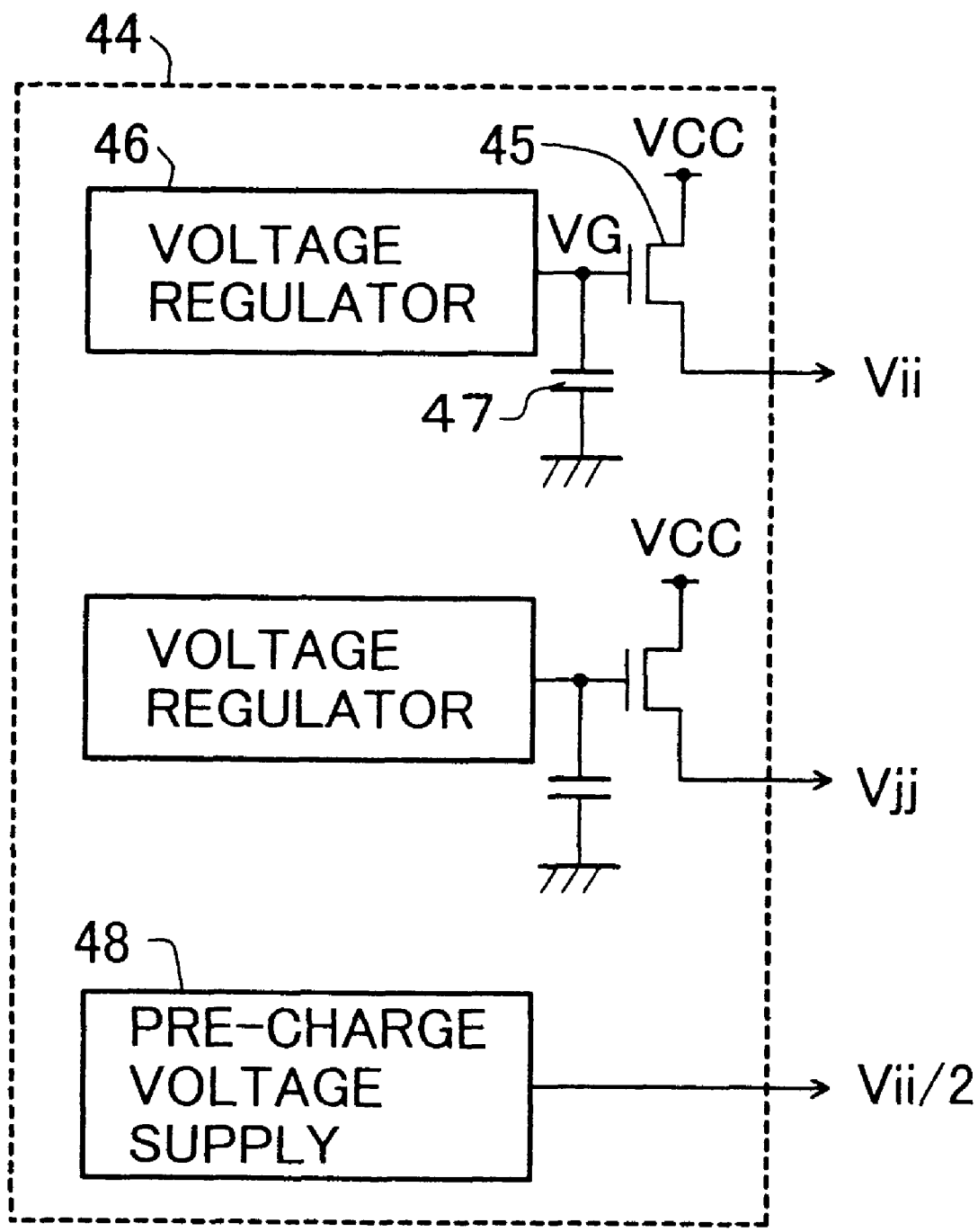
FIG. 5 is a circuit diagram showing a structural example of the power supply circuit in FIG. 1.

FIG. 5 shows a schematic structure of the power supply circuit 44.

In the circuit 44, the power supply voltage VCC supplied from the exterior is applied to the drain electrode of an NMOS transistor 45, the constant output voltage VG of a voltage regulation circuit 46 is provided to the gate electrode of the transistor 45, whereby the voltage Vii is taken out from the source electrode of the NMOS transistor 45. Since the NMOS transistor 45 is used in place of a PMOS transistor, without feedback of the voltage Vii to control the gate electrode of the NMOS transistor 45, the voltage Vii can be at an almost constant value (VG−Vth), where Vth is a threshold voltage of the NMOS transistor 45, so that the structure of the power supply circuit 44 is simplified. In order to stabilize the voltage Vii by reducing the output fluctuation, a capacitor 47 is connected to the output of the voltage regulation circuit 46.

Another circuit for generating the voltage Vjj is also constructed as the circuit to generate the voltage Vii. The voltage Vii/2 is generated at a pre-charge voltage supply circuit 48.

Referring back to FIG. 1, the output voltages VP and VN of the sense amplifier driving circuits 111 through 113 are provided to sense amplifier groups of the first through third rows in the bank BNK0, respectively. For example, power supply line connection for providing the voltages VP and VN from the sense amplifier driving circuit 113 to the sense amplifier 10 in the bank BNK0 is as shown in FIG. 2.

In FIG. 1, each of the arrangements between the selection control circuit 23 and the bank BNK1, the selection control circuit 24 and the bank BNK2, and the selection control circuit 25 and the bank BNK3 is identical to that between the selection control circuit 22 and the bank BNK0. The power supply voltages VH1 through VH3 each correspond to the power supply voltage VH0 in the bank BNK0.

Next, operation of the present embodiment constructed as mentioned above will be described with reference to FIG. 6.

In the above mentioned initial state immediately after the power being on, the selection control signals SC0 and *SC0 are low and high, respectively, the PMOS transistors 29 and 30 of the selection circuit 28 in FIG. 2 are off and on, respectively, and the voltage Vii is selected.

FIG. 6 shows the case where the banks BNK0 through BNK3 in FIG. 1 are selected successively.

If the bank BNK0 is selected and thereby the bank activation signal BRAS0 goes high, in response to this, the outputs SC0 and *SC0 of the selection control circuit 22 go high and low, respectively, the PMOS transistors 29 and 30 in FIG. 2 are turned on and off, respectively, and the voltage VH0 rises from Vii to Vjj. At the timing when the signal TS in FIG. 4 goes high, the sense amplifier control signals C0 and *C0 in FIG. 2 go high and low, respectively, and the power supply voltages VP and VN changes from Vii/2 to Vjj and 0V, respectively. Thereby the sense amplifier 10 is activated, and the voltage difference between the bit lines BL01 and *BL01 is amplified. After a predetermined time has elapsed from the activation of the sense amplifier 10 starting, the outputs SC0 and *SC0 of the selection control circuit 22 return to low and high, respectively, the PMOS transistors 29 and 30 are turned off and on, respectively, and the voltage VH0 drops to Vii.

It is noted that in order to reduce power consumption, only a selected memory cell block including a selected word line and the sense amplifier rows sandwiching this selected memory cell are activated in regard to each bank. For example, in a state where the sense amplifier control signals C0 and *C0 provided to the sense amplifier driving circuit 111 are low and high, respectively, the sense amplifier control signals C0 and *C0 provided to the sense amplifier driving circuits 112 and 113 go high and low, respectively. Therefore, the sense amplifier driving circuits 111 through 113 can not be replaced with one sense amplifier driving circuit for common use.

Next, the bank BNK1 is selected with the bank activation signal BS1 going high, and the same operation is performed for the bank BNK1 as in the bank BNK0. Operation for banks BNK2 and BNK3 thereafter is also the same.

In the first embodiment, based on the bank activation signals BRAS0 through BRAS3, the respective selection control circuits 22 through 25 operate independently each other, and by the outputs from the selection control circuits 22 through 25, the selection circuits for respective banks are independently controlled, and the power supply voltages from the power supply circuit 44 are provided via selection circuits and sense amplifier driving circuits to sense amplifiers, so that the voltages VH0 through VH3 become voltage Vjj for a necessary period in response to the activation of the respective banks.

Therefore, unnecessary consumption of the output currents from the power circuit 44 is reduced, and also the period for unnecessarily applying high voltage to transistors is reduced, whereby characteristic deterioration of the transistors is reduced.

Furthermore, since the lowering of the voltage difference ΔV between bit line pair after being read from the memory cell and before being amplified can be prevented, refresh cycle time can be lengthened and current consumption for refreshing can be reduced.

Second Embodiment

Figure 7:
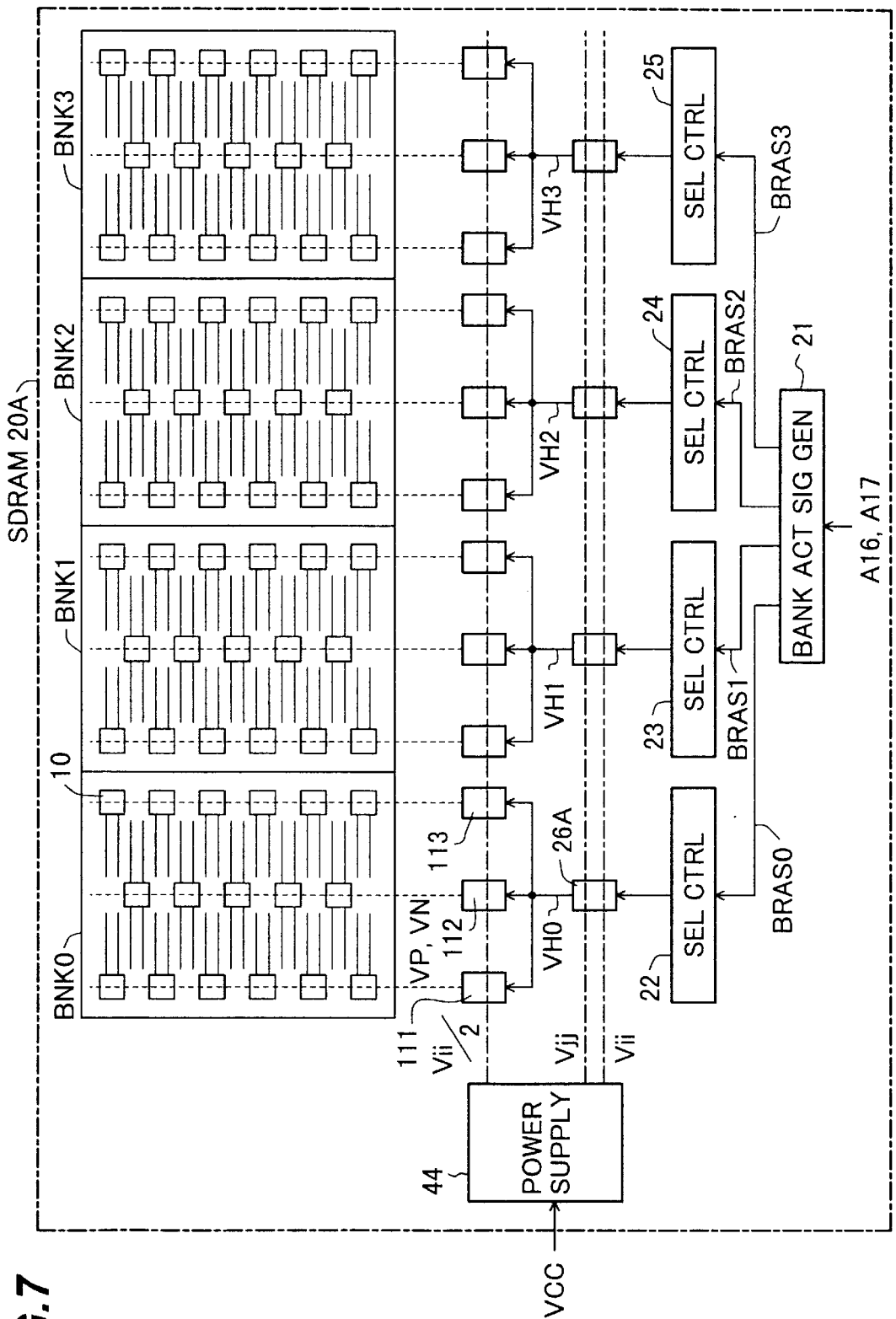
FIG. 7 is a block diagram showing a circuits associated with a sense amplifiers in a synchronous DRAM according to the second embodiment of the present invention.

FIG. 7 shows a circuit associated with the sense amplifiers of the SDRAM 20A according to the second embodiment of the present invention.

In the circuit, in place of the selection circuits 26 through 28 in FIG. 1, only one selection circuit 26A having the same structure as in the selection circuit 26 and a driving capacity greater than that of the selection circuit 26 is employed to commonly supply the output VH0 to the sense amplifier driving circuits 111 through 113. The structure for each of the banks BNK1 through BNK3 is the same as that for the bank BNK0.

Third Embodiment

Figure 8:
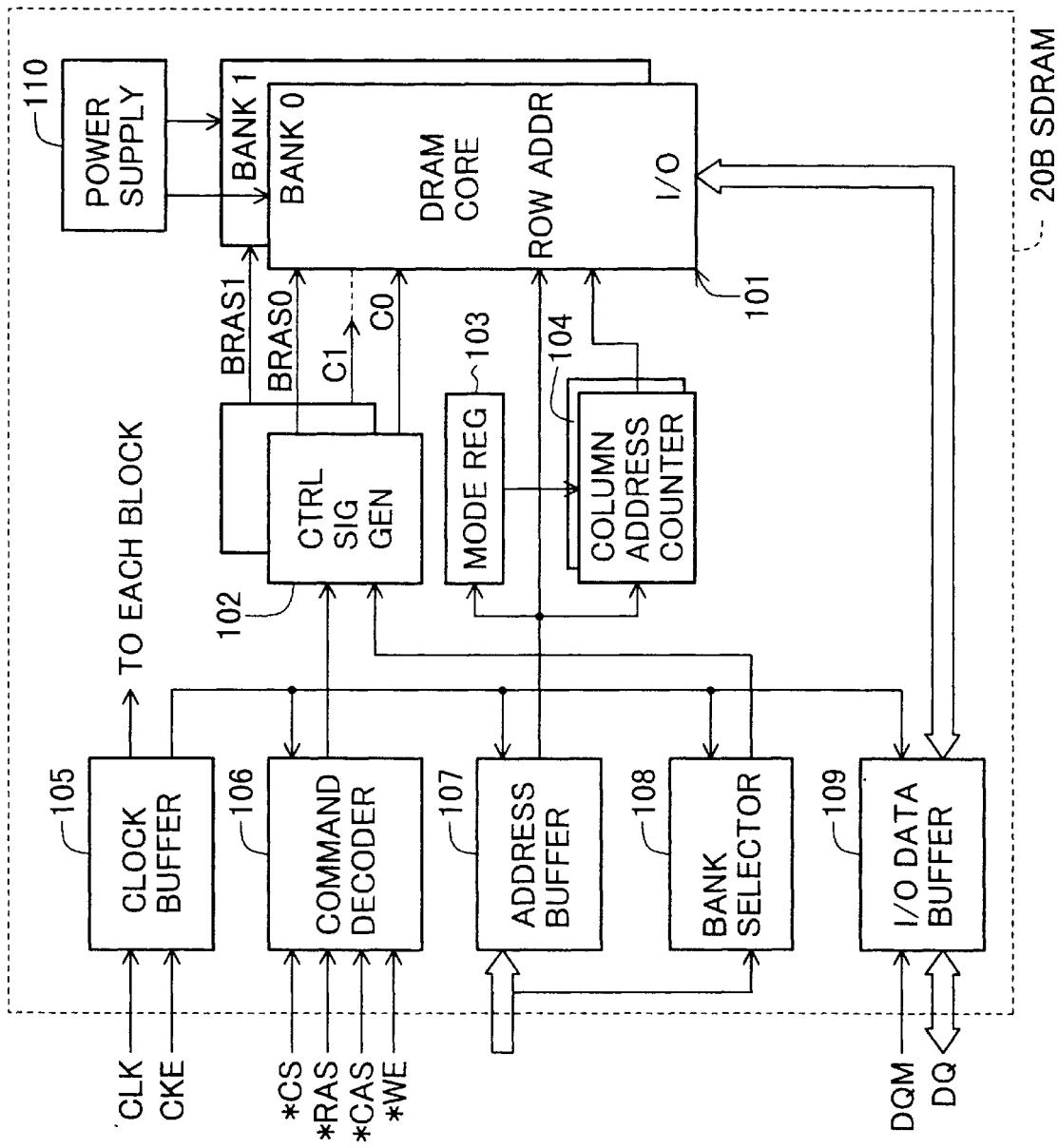
FIG. 8 is a schematic block diagram showing an SDRAM to which the present invention is applied.

FIG. 8 shows the schematic structure of an SDRAM 20B to which the present invention is applied.

As known, the SDRAM 20B comprises a DRAM core 101 having a bank 0 and a bank 1, a control signal generating circuit 102, a mode register 103, a column address counter 104, a clock buffer 105, a command decoder 106, an address buffer 107, a bank selector 108, an I/O data buffer 109, a power supply circuit 44A.

A clock signal CLK and a clock enable signal CKE are provided from the exterior to the clock buffer 105 while a chip selection signal *CS, a row address strobe signal *RAS, a column address strobe signal *CAS, and a write enable signal *WE are provided from the exterior to the command decoder 106. Further, an address ADDR is provided from the exterior to the address buffer 107 and the bank selector 108 while a data mask DQM is provided from the exterior to the I/O data buffer 109. In addition, input or output data DQ is accessed through the I/O data buffer 109.

The command decoder 106, the address buffer 107, the bank selector 108, and the I/O data buffer 109 are operated in synchronization with a clock signal from the clock buffer 105.

In the DRAM core 101, each bank has a memory cell array, a leak circuit which will be described later, and a sense amplifier. Bank activation signals BRAS0 and BRAS1, and sense amplifier activation signals C0 and C1 are provided from the control signal generating circuit 102 to the banks 0 and 1, respectively.

When the bank selector 108 recognizes bank 0 and the command decoder 106 recognizes an activation command with *RAS being active, the control signal generating circuit 102 activates a bank activation signal BRAS0 (the bank activation signal generating circuit 21 in FIGS. 1 and 7 comprises the blocks 102, 106 and 108). Next, in the bank 0, the word line selected by the row address from the address buffer 107 rises, thereby data is read from the memory cells selected by the word line onto bit line pairs with a small voltage difference on each bit line pair. In response to the sense amplifier activation signals C0, each small voltage difference is amplified. Next, in response to a read command or a write command from the command decoder 106, a column address from the address buffer 107 is latched at the column address counter 104 and thereby the selected bit line pairs in the bank 0 is connected to the data bus between the banks and the I/O data buffer 109 at the timing of the control signal from the control signal generating circuit 102.

Next, a description is given of a stabilized power-supply circuit which is the most significant part of this embodiment.

Figure 9:
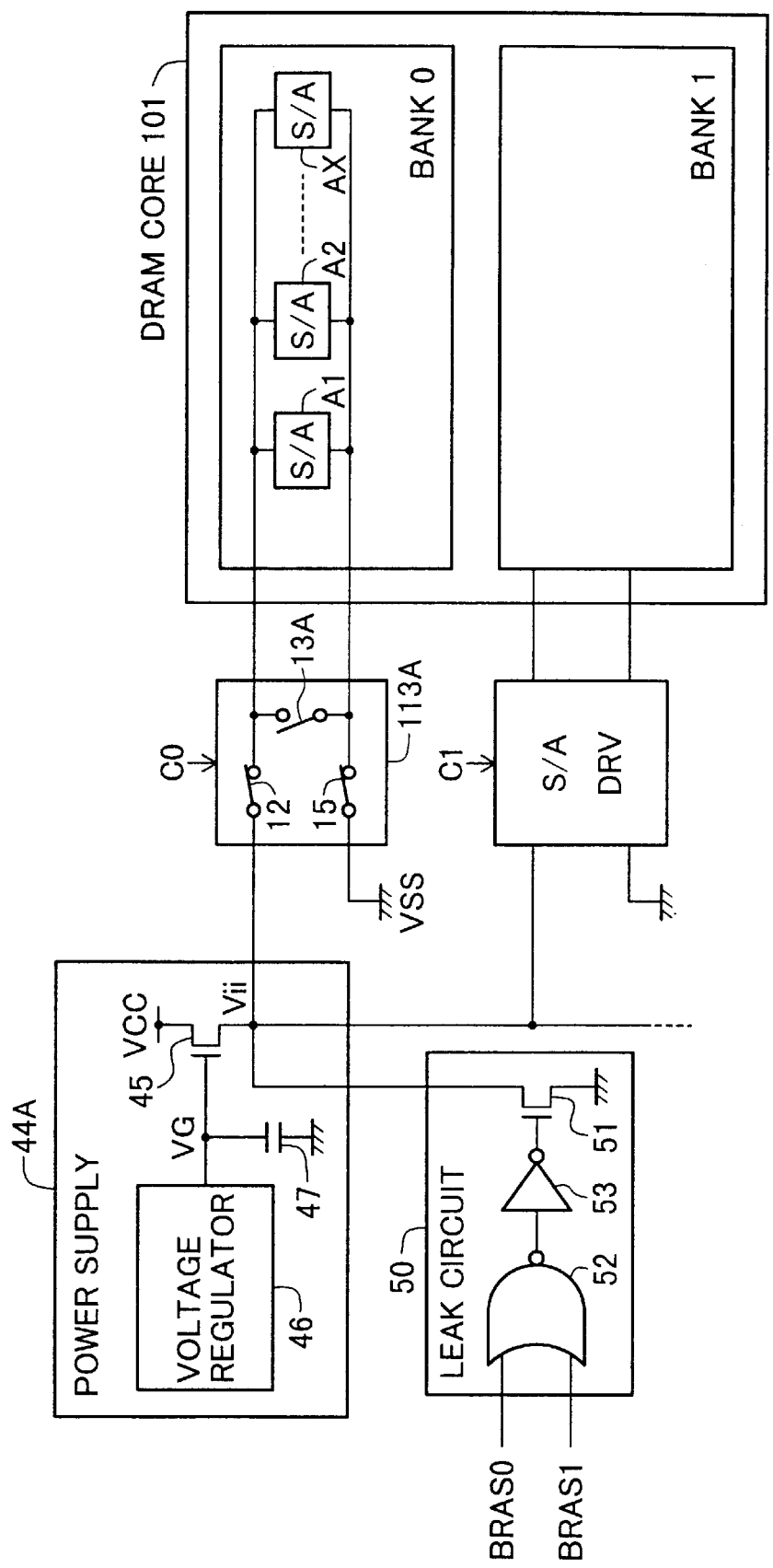
FIG. 9 is a schematic diagram showing a part of a DRAM core according to the third embodiment of the present invention.

FIG. 9 shows a circuit associated with the stabilized power-supply circuit in the SDRAM.

The DRAM core 101 is provided with banks 0 and 1, and bank 0 comprises a sense amplifier row consisting of a plurality of sense amplifiers A1, A2, . . . , AX, and a memory cell array (not shown). Actually, each bank has a plurality of sense amplifier rows, FIG. 9 shows only one for simplicity. The sense amplifiers A1, A2, . . . , AX are connected between the driving lines of voltages VP and VN, and the VP line is connected through the transistor switch 12 of the sense amplifier driving circuit 113A, which further has transistor switches 15 and 13A, to the source electrode of the NMOS transistor 45 which constitutes a power supply circuit 44A as the same shown in FIG. 5. The VN line is connected through the transistor switch 15 to the ground line. The transistor switch 13A for inactivating the sense amplifiers is connected between the VP and the VN lines.

As stated above, the relation Vii=VG−Vth approximately holds, where Vth is the threshold voltage of the NMOS transistor 45. To be exact, the output voltage Vii depends on the current I flowing the transistor 45 as shown in FIG. 10, where the power supply voltage VCC is at 2.5V and the gate voltage VG of the NMOS transistor is at 2.1V.

A leak circuit 50 comprises an NMOS transistor 51 connected between the source electrode of the NMOS transistor 45 and the ground line at VSS, and a control circuit. The control circuit consists of a NOR circuit 14a having inputs coupled to receive the bank activation signals BRAS0 and BRAS1 from the control signal generating circuit 102 in FIG. 8, and an inverter 53 connected between the output of the NOR gate 52 and the gate electrode of the NMOS transistor 51.

Figure 10:
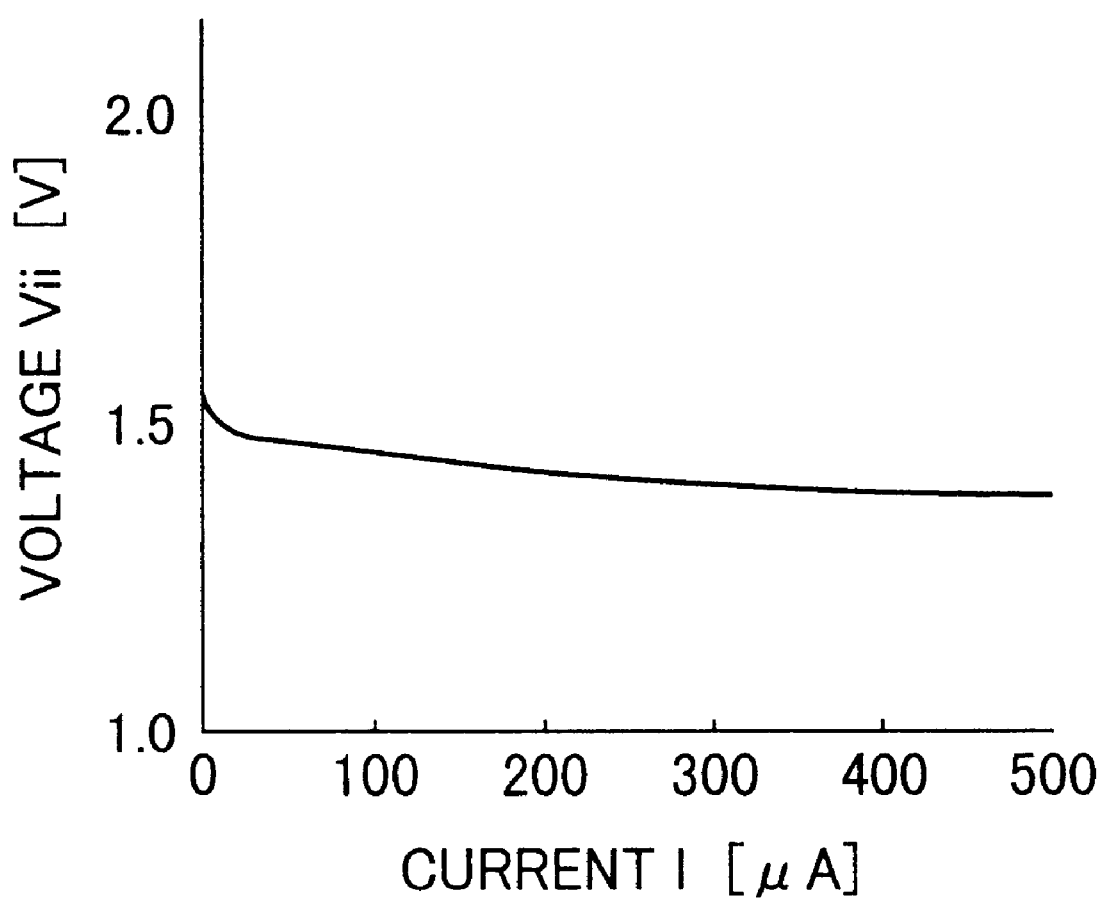
FIG. 10 is a diagram showing the relationship between the output voltage and the output current of a power supply circuit.

The NMOS transistor 51 is such a small size that the current flowing therethrough is small, for example, a value in the range of 1 through 10 μA in FIG. 10, whereby a wasteful power consumption by this current is negligibly small and the variation of the supply voltage Vii reduces effectively even if the current to the sense amplifiers becomes zero. Since this current is small, the NMOS transistor 51 is located near the NMOS transistor 45 in order to reduce a wiring resistance.

The circuit structure of the bank 1 and its peripheral circuit for the bank 1 is the same as that of the bank 0 and its peripheral circuit for the bank 0, except for bank-related lines.

The transistor 51 is turned on when any one of the bank activation signals BRAS0 and BRAS1 is high, whereby the wasteful power consumption becomes much smaller.

Figure 11:
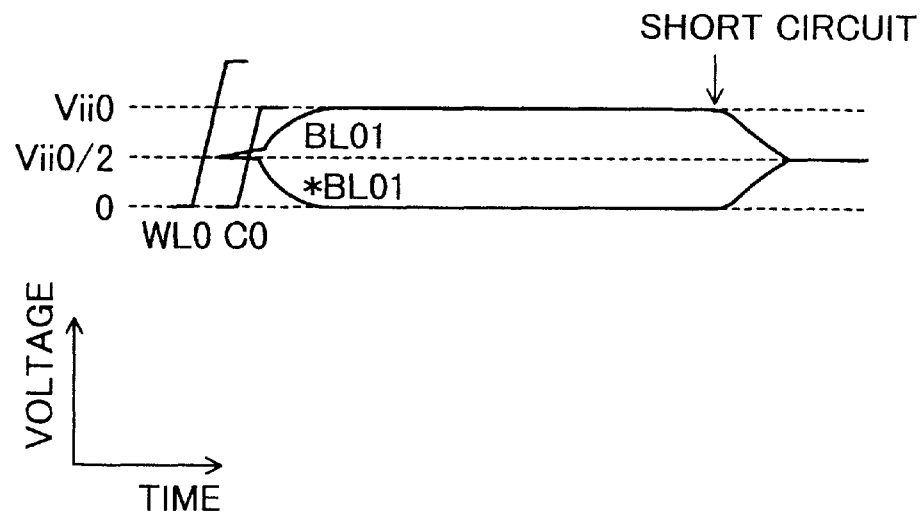
FIG. 11 is a time chart of the voltage of a bit line pair.

FIG. 11 is a time chart showing the change of the voltages of the bit line pair BL01 and *BL01 in the bank 0.

Initially, the sense amplifier activation signals C0 is low, whereby, in FIG. 9, the transistor switches 12 and 15 are off and the transistor switch 13A is on, and the voltages VP and VN each are Vii0/2, where Vii0 is a voltage Vii when the current flowing through the NMOS transistor 45 is equal to that of the NMOS transistor 51 in on-state. Both of the bank activation signals BRAS0 and BRAS1 are low, whereby the NMOS transistor 51 is off.

A bank address indicating the bank 0, a row address and a combination of control signals *CS, *RAS, *CAS and *WE indicating an activation command are provided to the bank selector 108, the address buffer 107 and the command decoder, respectively. The CKE is high, thereby the CLK is effective, and on a rise of the clock CLK, the activation command is issued from the command decoder 106.

The bank activation signal BRAS0 is activated and the NMOS transistor 51 is turned on. A word line WL corresponding to the row address in the bank 0 is raised, thereby data is read from the memory cells selected by the word line onto bit line pairs including BL0 and *BL0 with a small voltage difference on each bit line pair. In response to the sense amplifier activation signals C0 (actually, also a memory block address corresponding to the sense amplifier row) the transistor switch 13A is turned off and the transistor switches 12 and 15 are turned on thereby the sense amplifiers A1 through AX are activated, and each small voltage difference is amplified. With this amplification, for example, the voltages of the bit lines BL01 and *BL01 go toward VP=Vii0 and VN=0, respectively, as shown in FIG. 11.

After having reached Vii0 and 0, respectively, the current to the sense amplifiers is zero. However, since the NMOS transistor 51 is on, a current flows through the NMOS transistor 45 and the Vii remains at a constant value Vii0 without rising, whereby the bit line BL01 also remains at a constant Vii0.

After the bit line pairs fully swung, a column address and a combination of control signals *CS, *RAS, *CAS and *WE indicating a read command are provided to the address buffer 107 and the command decoder, respectively. On a rise of the clock CLK, the read command is issued from the command decoder 106.

A column address from the address buffer 107 is latched at the column address counter 104 and thereby the selected bit line pairs in the bank 0 is connected to the data bus between the banks and the I/O data buffer 109 at the timing of the control signal from the control signal generating circuit 102.

Figure 24:
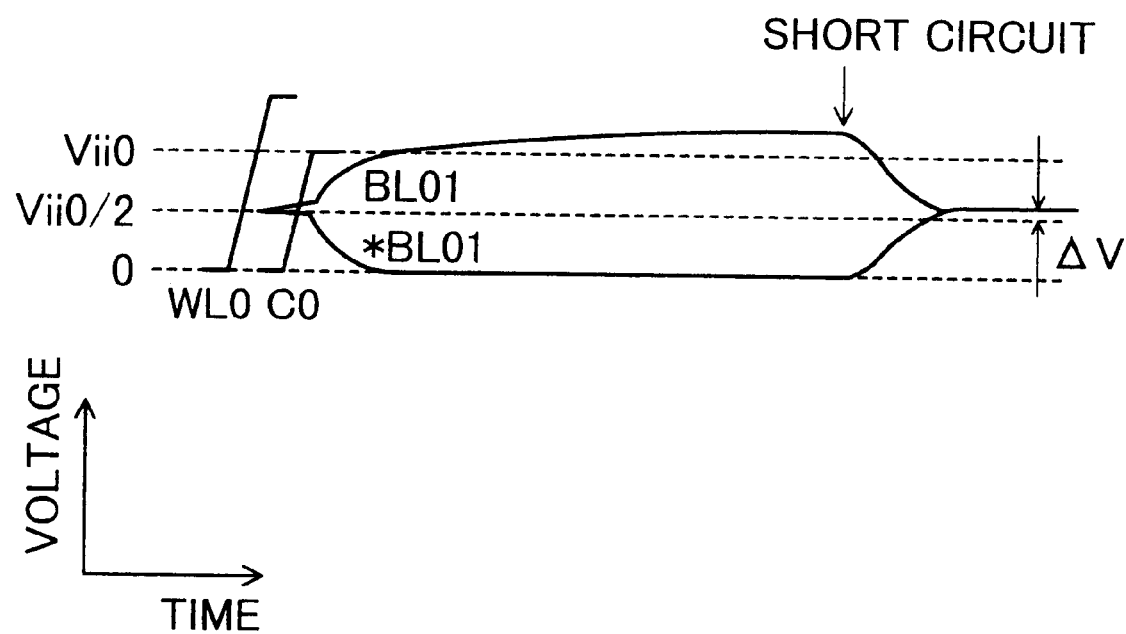
FIG. 24 is a time chart of the voltage of a bit line pair in a prior art DRAM core.

There is a case where a DRAM core is in a static state with a word line remaining high. In the prior art, since the Vii rises gradually, a current flows from the VP line through the corresponding sense amplifier to the bit line BL01, whereby the bit line BL01 also rises gradually over Vii0 as shown in FIG. 24. However, in the present invention, even if the word line WL is selected for a long time, the voltages of the VP line and the bit line BL01 remain at a constant value Vii0 without rising.

Thereafter, the signal C0 goes low, whereby the transistor switches 12 and 15 are turned off and the transistor switch 13A is turned on, the voltages VP and VN each become Vii0/2, and the sense amplifiers A1 through AX are inactivated.

Next, the bit line pairs are respectively short-circuited, and the bit line voltage becomes Vii0/2.

As a result, a voltage difference between a bit line pair after being read thereon from a memory cell and before being amplified is not reduced, whereby in regard to the sense amplifiers, the margin of operating without error becomes larger. That is, the sense amplifier 10 will operate without error with more reliability. Therefore, a refresh cycle time can be lengthened, resulting in reducing a wasteful current.

Figure 12:
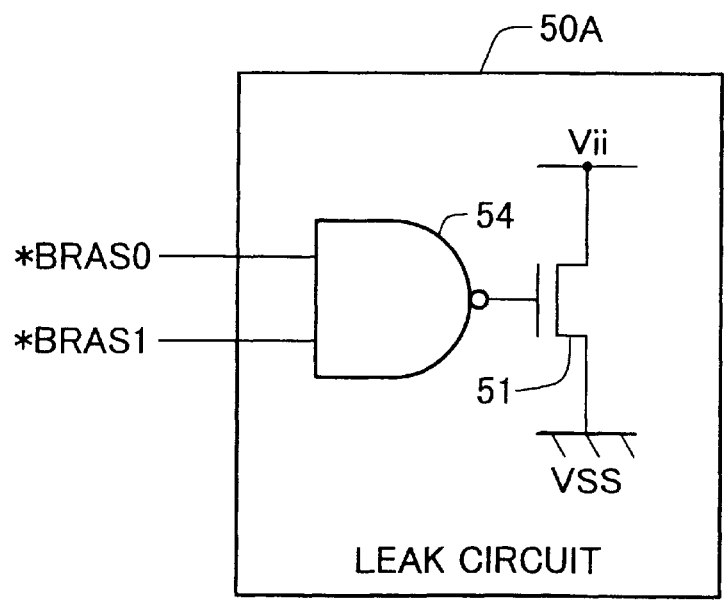
FIG. 12 is a diagram showing another example of a leak circuit.

FIG. 12 shows another example of a leak circuit 50A which comprises a NAND gate 50A as a control circuit instead of the NOR gate 52 and the inverter 53 in FIG. 9, and the NAND gate 50A has inputs coupled to receive the bank activation signals *BRAS0 and *BRAS1.

Fourth Embodiment

Figure 13:
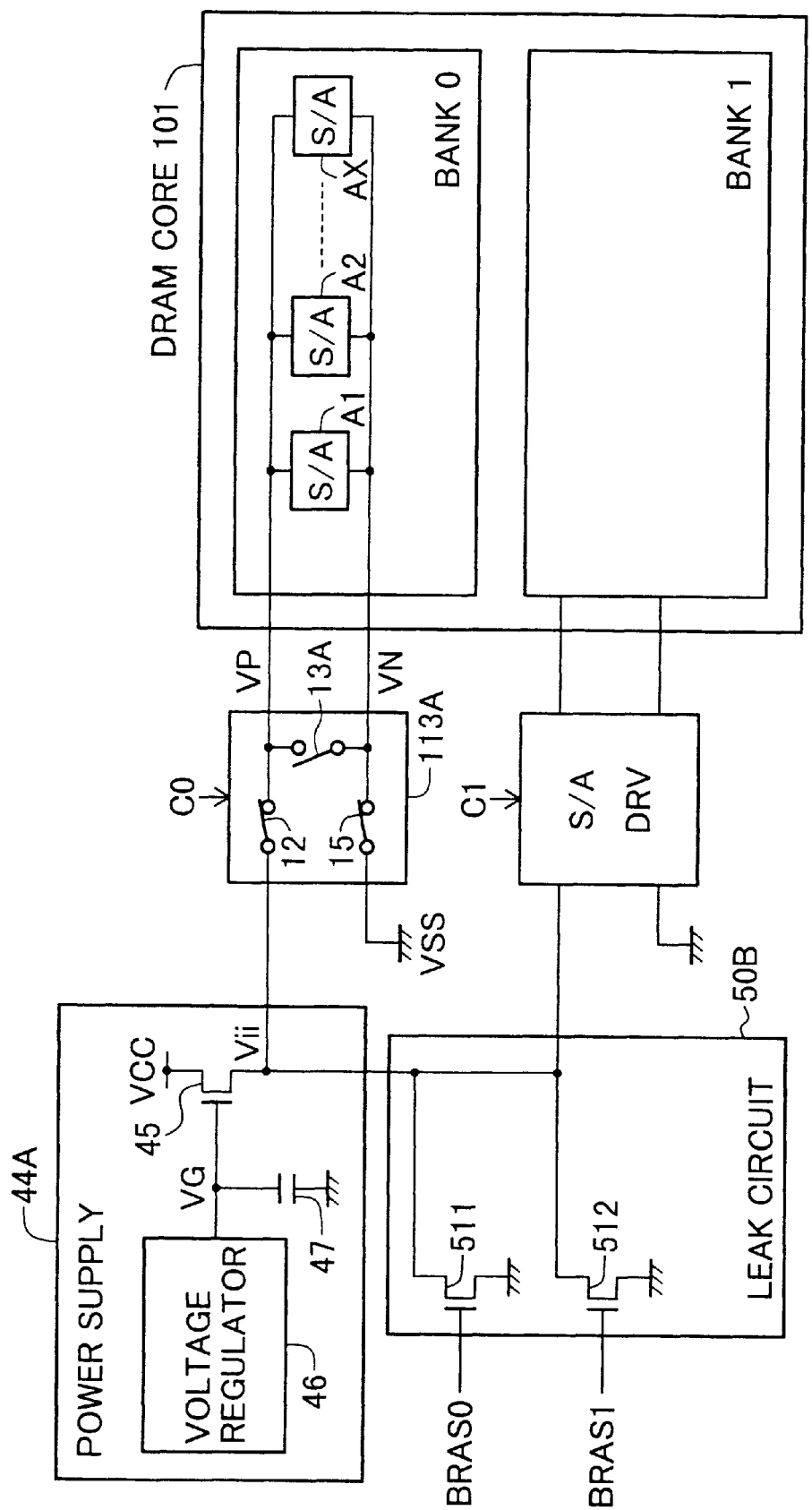
FIG. 13 is a schematic diagram showing a circuit associated with a stabilized power-supply circuit in a SDRAM according to the fourth embodiment of the present invention.

FIG. 13 shows a circuit associated with a stabilized power-supply circuit in a SDRAM according to the fourth embodiment of the present invention.

A leak circuit 50B comprises NMOS transistors 511 and 512 each connected between the source electrode of the NMOS transistor 45 and the ground line. The gate electrodes of the NMOS transistors 511 and 512 receive the bank activation signals BRAS0 and BRAS1, respectively.

Therefore, when the bank activation signal BRAS0 or BRAS1 is high, the transistor 511 or 512 is on, respectively. A wasteful power consumption by the current flowing to the leak circuit 50B is negligibly small and the variation of the supply voltage Vii reduces effectively even if the current to the sense amplifiers becomes zero.

According to the fourth embodiment of the present invention, since the leak circuit 50B consists of only the transistors 511 and 512, it can be more simply constructed. Further, a transistor for leaking in the leak circuit 50B is arranged for each bank, the same effect of stabilization is got even if any bank is activated.

Fifth Embodiment

Figure 14:
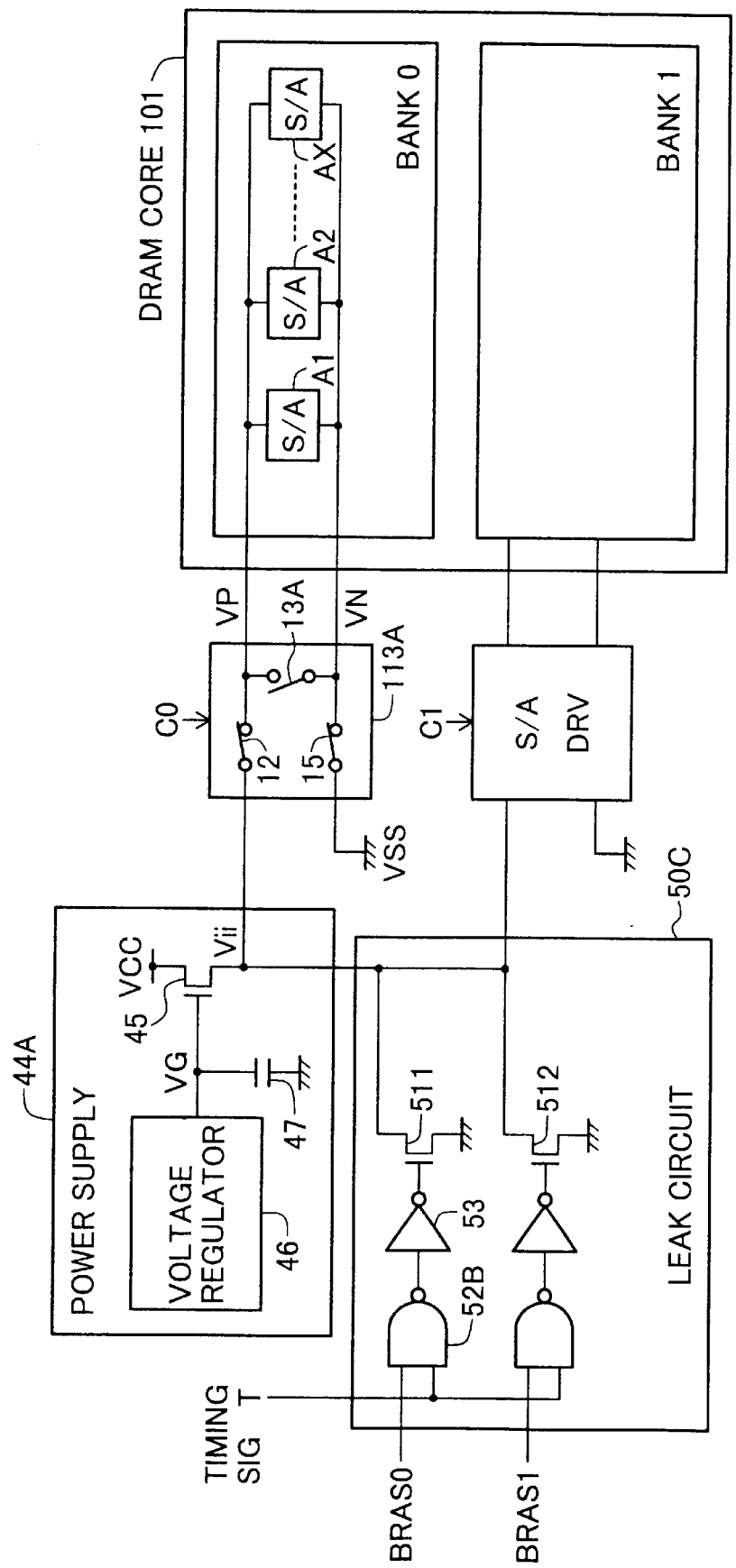
FIG. 14 is a schematic diagram showing a circuit associated with a stabilized power-supply circuit in a SDRAM according to the fifth embodiment of the present invention.

FIG. 14 is a diagram showing a circuit associated with a stabilized power-supply circuit in a SDRAM according to the fifth embodiment of the present invention.

A leak circuit 50C comprises the leak circuit 50B in FIG. 13, and further comprises an AND gate 52B having inputs coupled to receive the bank activation signal BRAS0 and a timing signal T, an inverter 53 connected between the output of the AND gate 52B and the gate electrode of the NMOS transistor 51, and another combination of a AND gate and an inverter corresponding to the NMOS transistor 512.

The timing signal T is one which becomes active after a predetermined time has elapsed from the rise of a word line. This predetermined time is such one that the VP line is at a Vii0 at the resetting time of bit line pairs and the time is as long as possible to reduce a wasteful power consumption.

The NMOS transistor 511 or 512 is on after the predetermined time has elapsed from the rise of a word line until the bank activation signal BRAS0 or BRAS1 becomes inactive.

According to the fifth embodiment of the present invention, since the leak time of the leak circuit 50C is shorter than that of the circuit 50B, wasteful power consumption can be much reduced.

Sixth Embodiment

Figure 15:
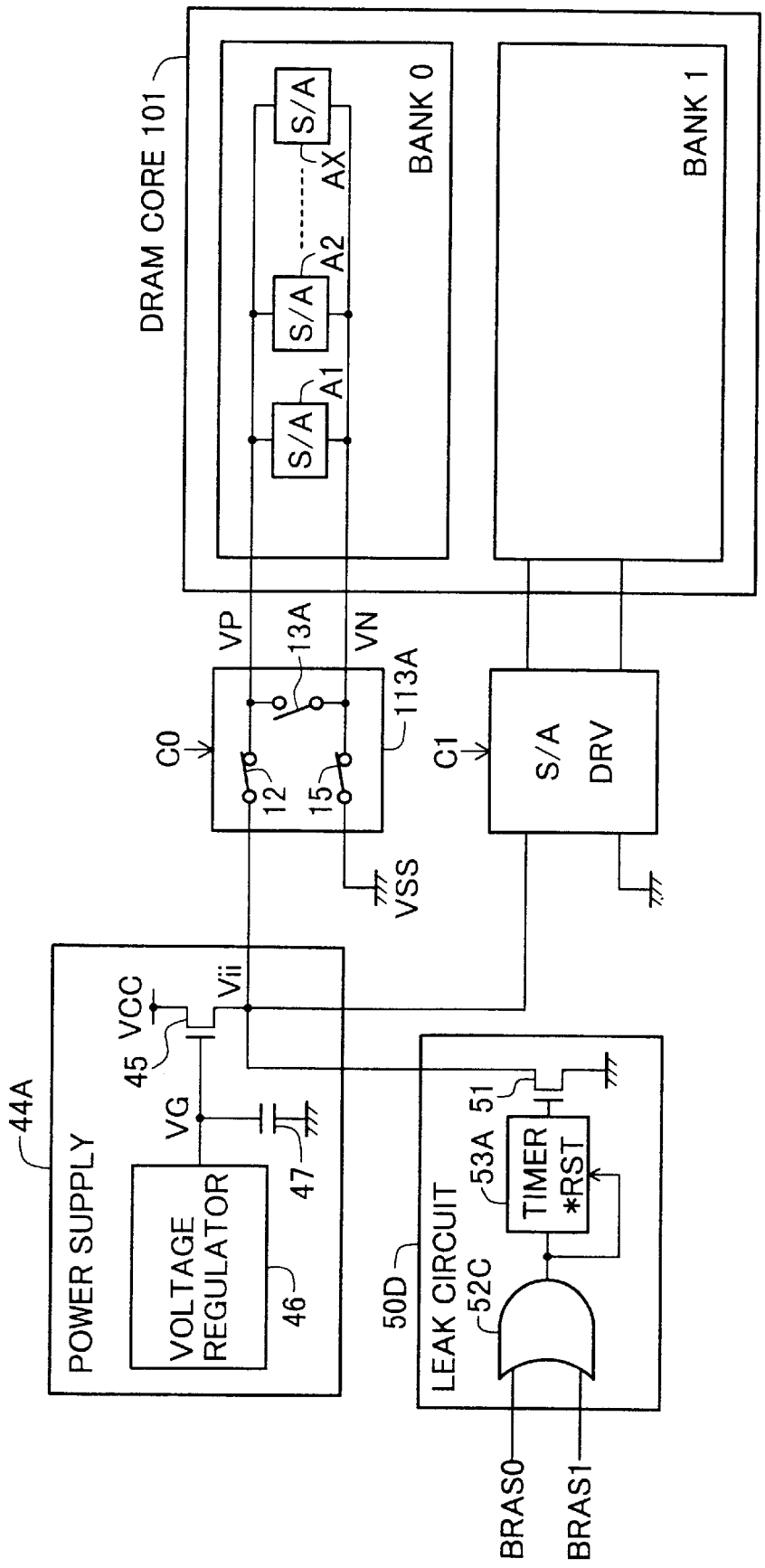
FIG. 15 is a schematic diagram showing a circuit associated with a stabilized power-supply circuit in a SDRAM according to the sixth embodiment of the present invention.

FIG. 15 is a diagram showing a circuit associated with a stabilized power-supply circuit in a SDRAM according to the sixth embodiment of the present invention.

A leak circuit 50D comprises an on-delay timer 53A between the output of an OR gate 52C and the gate electrode of the NMOS transistor 51. These OR gate 52C and timer 53A constructs a control circuit. The OR gate 52C has inputs coupled to receive the bank activation signals BRAS0 and BRAS1.

The NMOS transistor 51 is on after the set time of the timer 53A has elapsed from the rise of the bank activation signal BRAS0 or BRAS1 had become high until the bank activation signals BRAS0 and BRAS1 becomes low. The timer 53A is reset when the output of the OR gate 52C turns low.

According to the sixth embodiment of the present invention, since the leak time of the leak circuit 50D is shorter than that of the circuit 50B, wasteful power consumption can be much reduced as the fifth embodiment.

Figure 16:
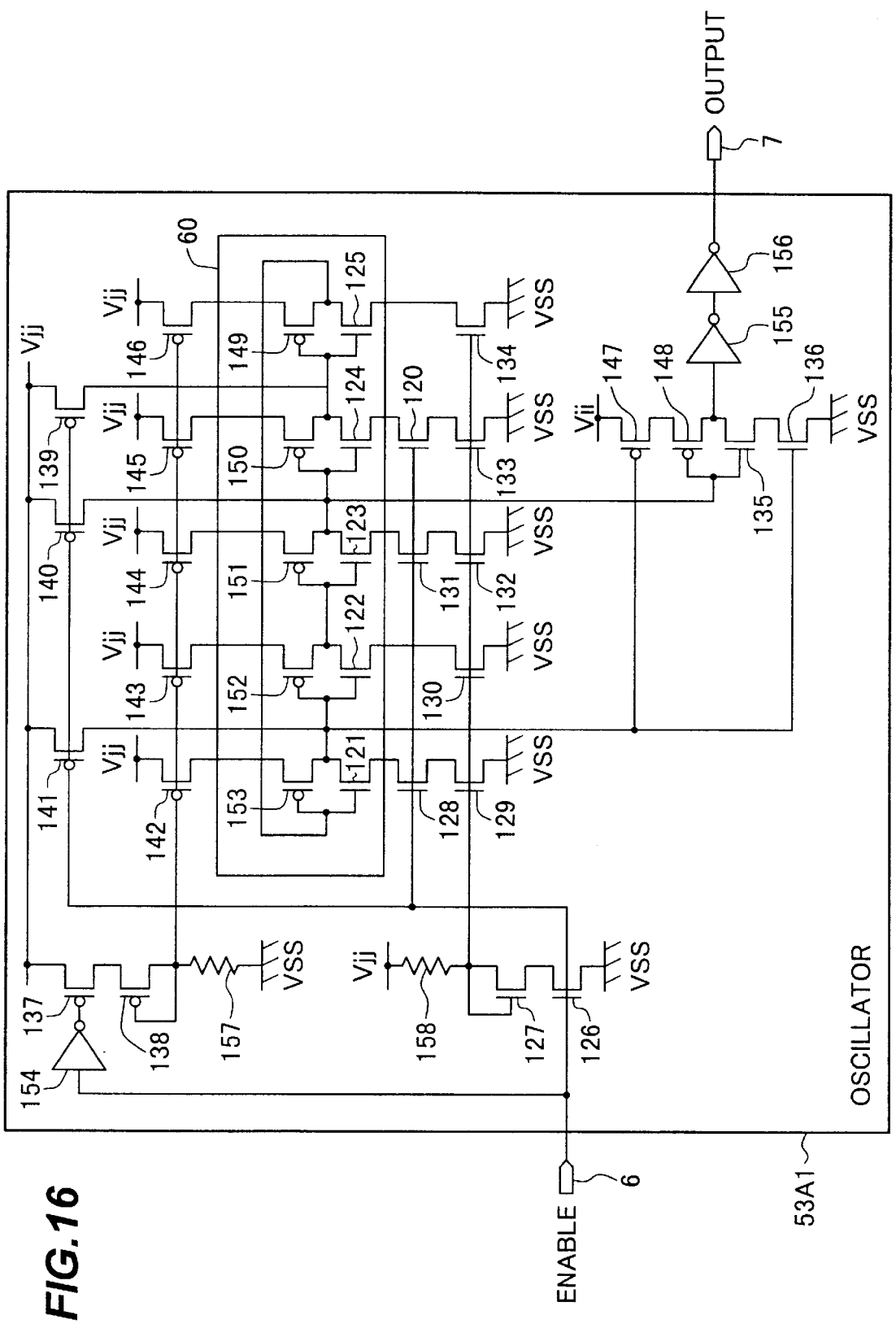
FIG. 16 is a diagram showing a structural example of an oscillator circuit composing the timer in FIG. 15.
Figure 17:
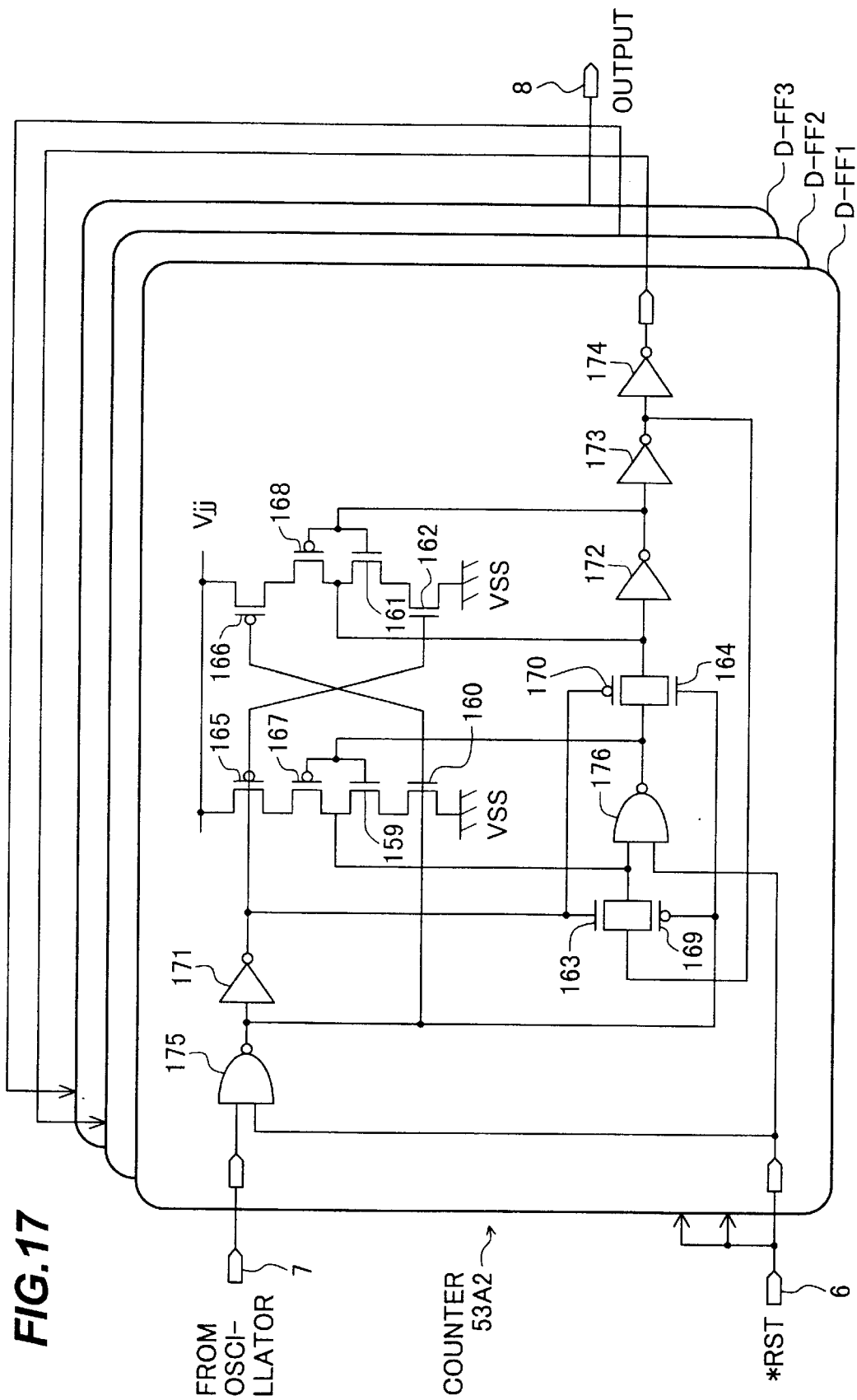
FIG. 17 is a diagram showing a structural example of a counter circuit composing the timer in FIG. 15.

The timer 53A can be composed of, for example, a combination of an oscillator circuit and a counter circuit for counting pulses from the oscillator circuit. FIG. 16 and FIG. 17 show an oscillator circuit 53A1 and a counter circuit 53A2, respectively, which are applicable to the timer 53A and are known in the art.

As shown in FIG. 16, the oscillator circuit 53A1 comprises NMOS transistors 120 to 136, PMOS transistors 137 to 153, inverters 154 to 156, and resistors 157 and 158. The NMOS transistors 121 to 125 and the PMOS transistors 149 to 153 form a ring oscillating circuit 60. When an activated bank-activation signal is provided from the enable input 6 of the oscillator circuit 53A1, the oscillator circuit 53A1 begins to operate, and pulses generated from the ring oscillating circuit 60 are provided from the output 7.

As shown in FIG. 17, the counter circuit 53A2 comprises D flip-flops D-FF1 to D-FF3 connected in cascade. The D-FF1 to D-FF3 are the same structure to each other. The D-FF1 comprises NMOS transistors 159 to 164, PMOS transistors 165 to 170, inverters 171 to 174, and NAND gates 75 and 76. The signal from the output 7 of the oscillator circuit 53A1 is provided to the clock input 7 of the counter circuit 53A2, the output signal of the OR gate 52C is provided to the reset input 6 (*RST) of the counter circuit 53A2, and the time-up signal is provided from the output 8 of the D-FF3. With increasing or decreasing the number of the D flip-flops connected in cascade, it is possible to adjust the required delay time.

It is noted that the timer 53A may be constructed of the oscillator circuit 53A1 if the signal of an appropriate time period can be generated by the oscillator circuit 53A1.

Seventh Embodiment

Figure 18:
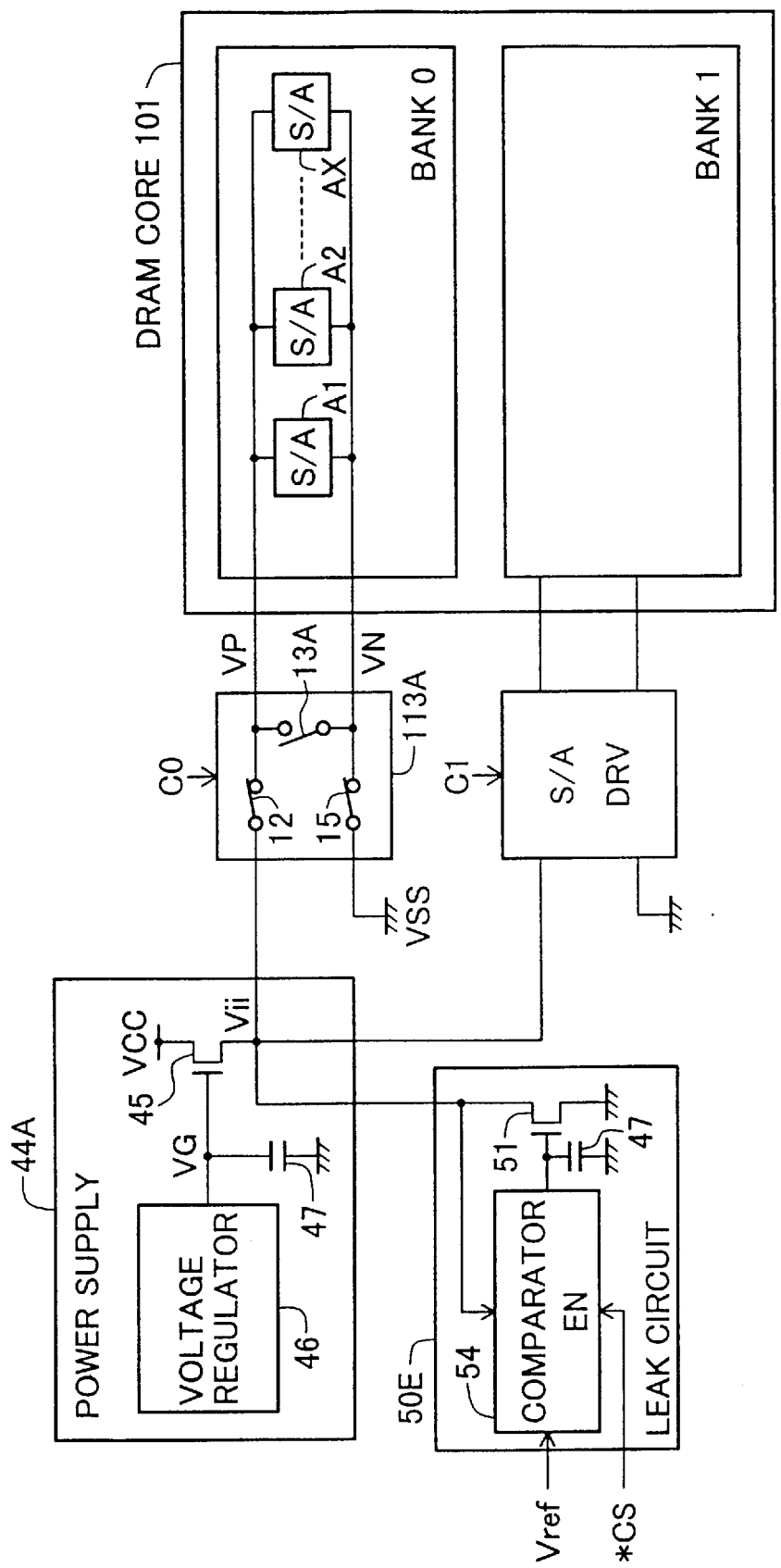
FIG. 18 is a schematic diagram showing a circuit associated with a stabilized power-supply circuit in a SDRAM according to the seventh embodiment of the present invention.

FIG. 18 is a diagram showing a circuit associated with a stabilized power-supply circuit in a SDRAM according to the seventh embodiment of the present invention.

The leak circuit 50E comprises the NMOS transistor 51 connected between the source electrode of the NMOS transistor 45 and the ground line, and a comparator 54, as a control circuit, for comparing a voltage proportional to Vii with a reference voltage Vref and providing an output to the gate electrode of the NMOS transistor 51 in response to the compared result. If KVii>Vref, then the output of the comparator 54 is high to make the NMOS transistor 51 be on, or else the output of the comparator 54 is low to make the NMOS transistor 51 be off, where the K is a proportional constant and Vreff/K=Vii0.

Figure 19:
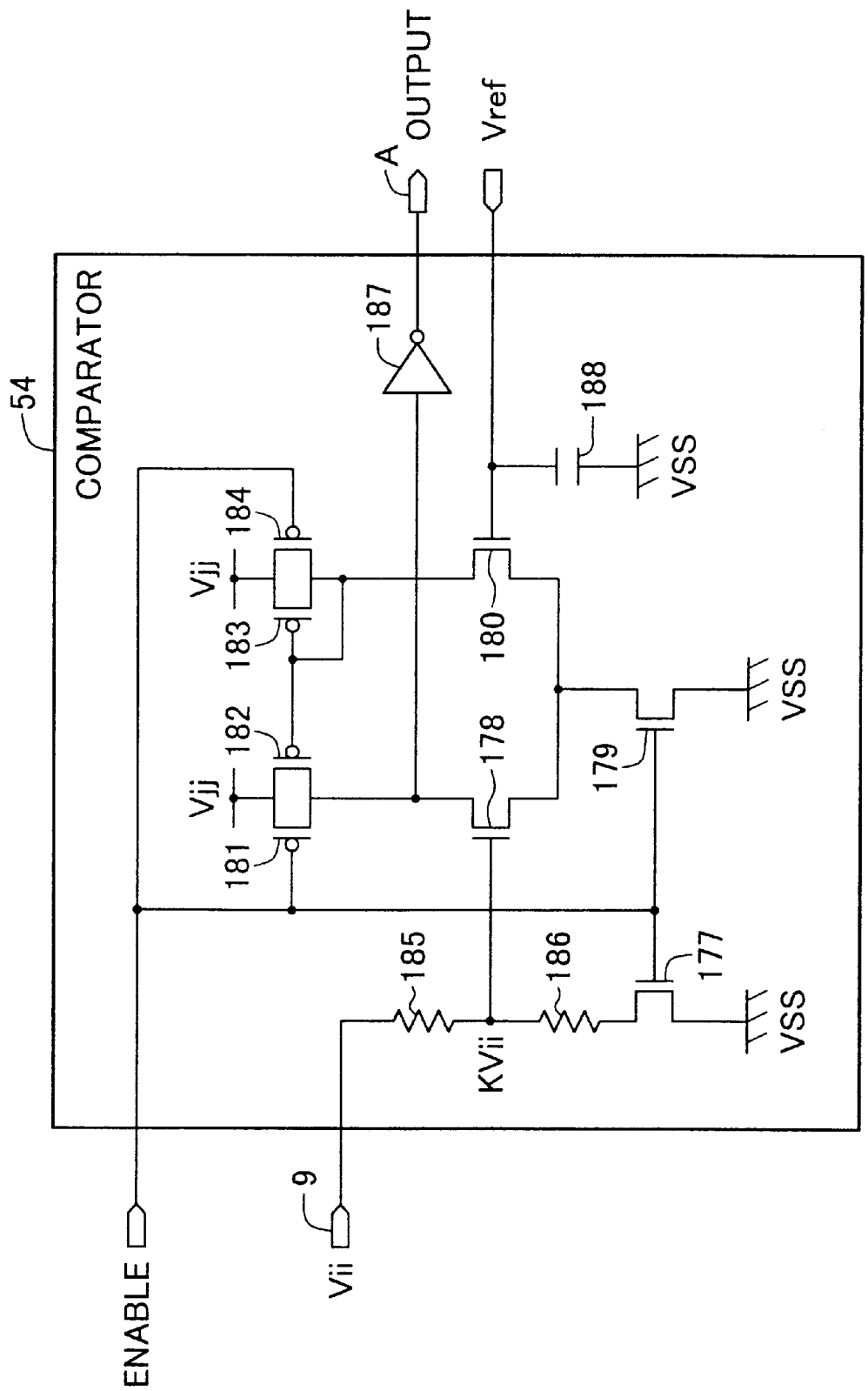
FIG. 19 is a diagram showing a structural example of the comparator in FIG. 15.

FIG. 19 shows a structural example of the comparator 54.

The comparator 54 comprises NMOS transistors 177 to 180, PMOS transistors 181 to 184, resistors 185 and 186, an inverter 187, and a capacitor 188. The comparator 54 compares the voltage KVii, which is obtained by dividing the voltage Vii provided from the input 9 with the resistors 185 and 186, with the reference voltage Vref, and when KVii>Vref, the output A is high.

To the ENABLE input EN of the comparator 54, for example, a chip enable signal CS is provided, and if the enable input EN is low, the NMOS transistors 177 and 179 are off and the output A is low, whereby a wasteful power consumption is reduced.

Eighth Embodiment

Figure 20:
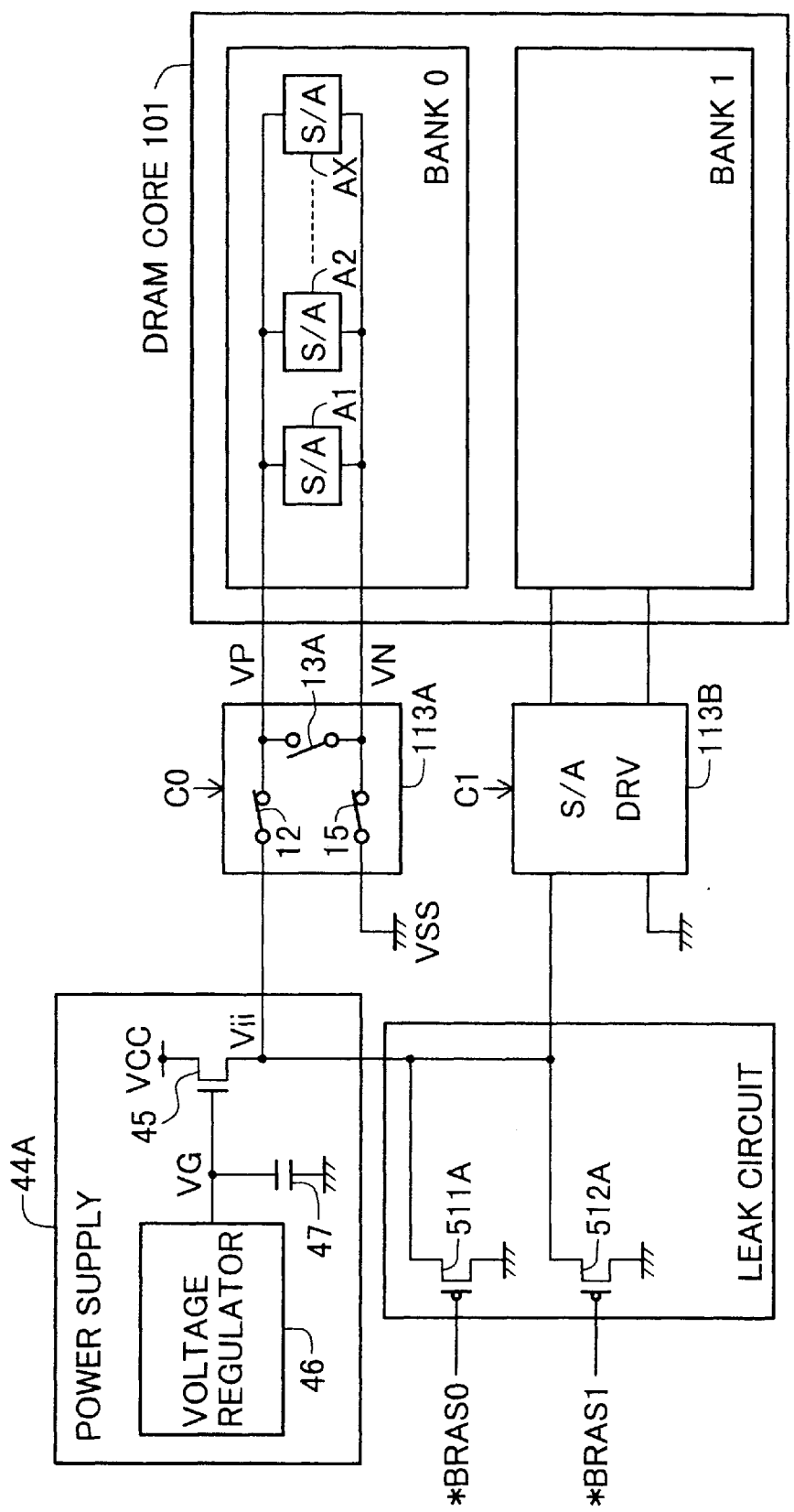
FIG. 20 is a schematic diagram showing a circuit associated with a stabilized power-supply circuit in a SDRAM according to the eighth embodiment of the present invention.

FIG. 20 is a diagram showing a circuit associated with a stabilized power-supply circuit in a SDRAM according to the eighth embodiment of the present invention.

A leak circuit 50F comprises PMOS transistors 511A and 512A instead of the NMOS transistors 511 and 512 in FIG. 13, and the bank activation signals *BRAS0 and *BRAS1 instead of the signals BRAS0 and BRAS1 are provided to the gate electrodes of the PMOS transistors 511A and 512A, respectively.

Although preferred embodiments of the present invention has been described, it is to be understood that the invention is not limited thereto and that various changes and modifications may be made without departing from the spirit and scope of the invention.

For example, in place of the PMOS transistors 29 and 30 in FIG. 2, other kinds of switch elements may be used.

Also, instead of driving one sense amplifier row by the sense amplifier driving circuit 111 in FIG. 1, it may be such a structure that this sense amplifier row is divided into a plurality of sense amplifier groups, sense amplifier driving circuits with smaller driving capacity than the sense amplifier driving circuit 111 are employed for each sense amplifier group, the output of the selection circuit 26 is commonly supplied to the sense amplifier groups through the respective sense amplifier driving circuits. This is the same as for other sense amplifier driving circuits in FIGS. 1 and 7.

Furthermore, the bit line pre-charge voltage is not limited to the voltage Vii/2, and it may be a voltage Vii or a ground voltage, for example. In FIG. 2, the sense amplifier inactivating voltage provided to the sense amplifier driving circuit 113 is the same as the bit line pre-charge voltage provided to the pre-charge circuit 18.

For example, when the bit line pre-charge voltage is the voltage Vii, the voltage Vii is provided to the sense amplifier driving circuit 113 in place of the voltage Vii/2. In this case, the voltage VH0 is fixed to the Vii, and to the source electrode of the NMOS transistor 15, either the ground voltage for normally activating the sense amplifier or the negative voltage for activating the sense amplifier faster is provided from a selection circuit (not shown). This selection circuit is controlled by the selection control signals SC0 and *SC0 in FIG. 4, and when the signal SC0 is high or low, the negative or ground voltage is selected, respectively.

When the bit line pre-charge voltage is the ground voltage, the power supply voltage VH0 supplied to the sense amplifier driving circuit 113 is switched over as in the case of the embodiment mentioned above.

The transistors 45 and 51 may be other kind such as MIS or bipolar transistors.

Furthermore, in FIG. 9, a normally high voltage or a chip selection signal may be provided to the gate electrode of the NMOS transistors 51 without employing the NOR gate 52 and the inverter 53.

In FIG. 15 for example, the sense amplifier driving circuit 113A may be the same as the circuit 113 in FIG. 2, and further the selection circuit 28 in FIG. 2 may be inserted between the transistor switch 12 and the Vii output in order to overdrive the sense amplifiers with Vjj. In this case, the timer is adjusted so that the transistor becomes on after switched from Vjj to Vii by the selection circuit 28.

A power supply circuit including a leak circuit of the present invention is applicable not only to a semiconductor memory device but also to various semiconductor devices.

What is claimed is:

1. A power supply circuit, for driving a load, comprising:
   a voltage regulation circuit for providing a regulated voltage Vii lower than a first power supply voltage, including an FET which has a drain electrode coupled to said first power supply voltage, a source electrode coupled to said load and a gate electrode coupled to receive a given voltage; and
   a leak circuit including a transistor which has a drain electrode coupled to said load, a source electrode coupled to a second power supply voltage and a gate electrode receiving a voltage to make said transistor be on for leaking a current flowing therethrough.

2. The power supply circuit according to claim 1, wherein said leak circuit further comprises a control circuit for controlling the voltage of said gate electrode of said transistor in such a way that said transistor is on at least when said load is active and a current to said load is off.

3. The power supply circuit according to claim 2, wherein said control circuit is a comparator for comparing a voltage proportional to said regulated voltage Vii with a reference voltage Vref and providing an output to said gate electrode of said transistor in response to a compared result.

4. The power supply circuit according to claim 3, wherein said comparator provides its output to said gate electrode of said transistor in such a way that if KVii>Vref, then said transistor is on, or else said transistor is off, where Vii is said regulated voltage, K is a proportional constant and Vref is said reference voltage.

5. The power supply circuit according to claim 1, wherein said load is sense amplifiers in a semiconductor memory device.

6. The power supply circuit according to claim 5, wherein said sense amplifiers is in a bank having a memory cell array, and said gate electrode of said transistor is coupled to receive a bank activation signal to make said transistor be on when said bank activation signal is active.

7. The power supply circuit according to claim 5, wherein said sense amplifiers is in a bank having a memory cell array, said leak circuit further comprises a control circuit for controlling the voltage of said gate electrode of said transistor in such a way that said transistor is on at least when said load is active and a current to said sense amplifiers is off.

8. The power supply circuit according to claim 7, wherein said control circuit comprises a timer circuit having an input coupled to receive a bank activation signal, and an output coupled to provide a delayed bank activation signal to said gate electrode of said transistor.

9. The power supply circuit according to claim 8, wherein said timer circuit comprises:
   an oscillator circuit having an input coupled to receive said bank activation signal as an enable signal, and an output to provide a clock signal; and
   a counter having a clock input coupled to receive said clock signal, and an output to provide a most significant bit of said counter as said delayed bank activation signal.

10. A semiconductor memory device comprises:
   a bank; and
   a power supply circuit for driving sense amplifiers;
   wherein said power supply circuit comprises:
      a voltage regulation circuit for providing a regulated voltage Vii lower than a first power supply voltage, including an FET which has a drain electrode coupled to said first power supply voltage, a source electrode coupled to said load and a gate electrode coupled to receive a given voltage; and a leak circuit including a transistor which has a drain electrode coupled to said load, a source electrode coupled to a second power supply voltage and a gate electrode receiving a voltage to make said transistor be on for leaking a current flowing therethrough.

11. The semiconductor memory device according to claim 10, wherein said leak circuit further comprises a control circuit for controlling the voltage of said gate electrode of said transistor in such a way that said transistor is on at least when said load is active and a current to said load is off.

* * * * *